United States Patent [19]
Sugiura et al.

[11] Patent Number: 5,327,387
[45] Date of Patent: Jul. 5, 1994

[54] DYNAMIC RANDOM ACCESS MEMORY HAVING AN IMPROVED OPERATIONAL STABILITY

[75] Inventors: Akira Sugiura, Kasugai; Yukinori Kodama, Kawasaki, both of Japan

[73] Assignees: Fujitsu Limited; Fujitsu VLSI Limited, Kawasaki, Japan

[21] Appl. No.: 971,630

[22] Filed: Nov. 5, 1992

[30] Foreign Application Priority Data

Nov. 5, 1991 [JP] Japan .................. 3-288753

[51] Int. Cl.⁵ .............................. G11C 8/00
[52] U.S. Cl. ...................... 365/222; 365/189.01
[58] Field of Search .......... 365/233.5, 230.03, 189.01, 365/189.08, 190, 194, 222, 233

[56] References Cited

U.S. PATENT DOCUMENTS

| | | | |
|---|---|---|---|
| 4,747,082 | 5/1988 | Minato et al. | 365/222 |
| 4,827,453 | 5/1989 | Sawada et al. | 365/222 |
| 4,984,208 | 1/1991 | Sawada et al. | 365/230.06 |

Primary Examiner—Eugene R. LaRoche
Assistant Examiner—Vu Le
Attorney, Agent, or Firm—Staas & Halsey

[57] ABSTRACT

A dynamic random access memory comprises a CBR refresh detection unit for detecting a commencement of a CBR refreshing cycle and a control signal generation unit for deactivating data output during the CBR cycle, both of the CBR refresh detection unit and the control signal generation unit being supplied with a /RAS signal and a /CAS signal simultaneously, wherein the dynamic random access memory further comprises a CBR refresh control unit supplied with an output of the CBR refresh detection unit and further with an output of the control signal generation unit for producing a control signal during the CBR refreshing cycle such that the control signal is produced in response to the leading edge of the /RAS signal and terminated in response to the trailing edge of the /CAS signal. Thereby, an output buffer circuit is controlled in response to the output of the control signal generation unit and the control signal of the CBR refresh control unit to set the output buffer circuit in the high impedance state during the CBR refreshing cycle.

9 Claims, 26 Drawing Sheets

FIG. 4(A) RAS (PRIOR ART)
FIG. 4(B) SIO0 (PRIOR ART)

FIG. 23
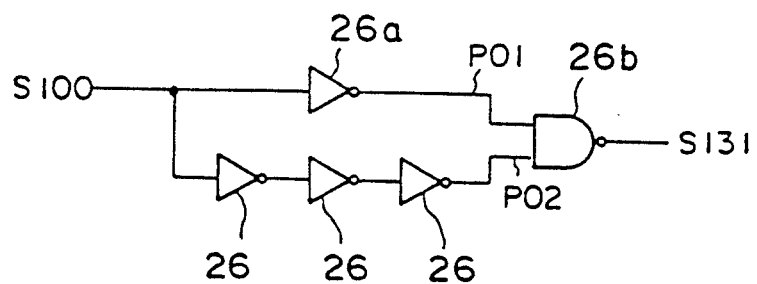
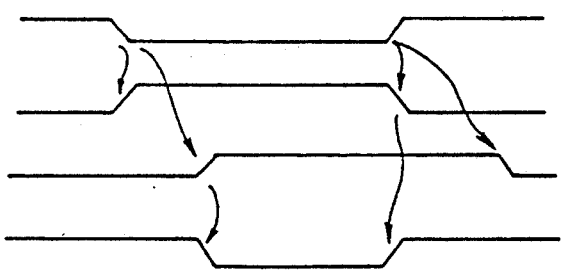

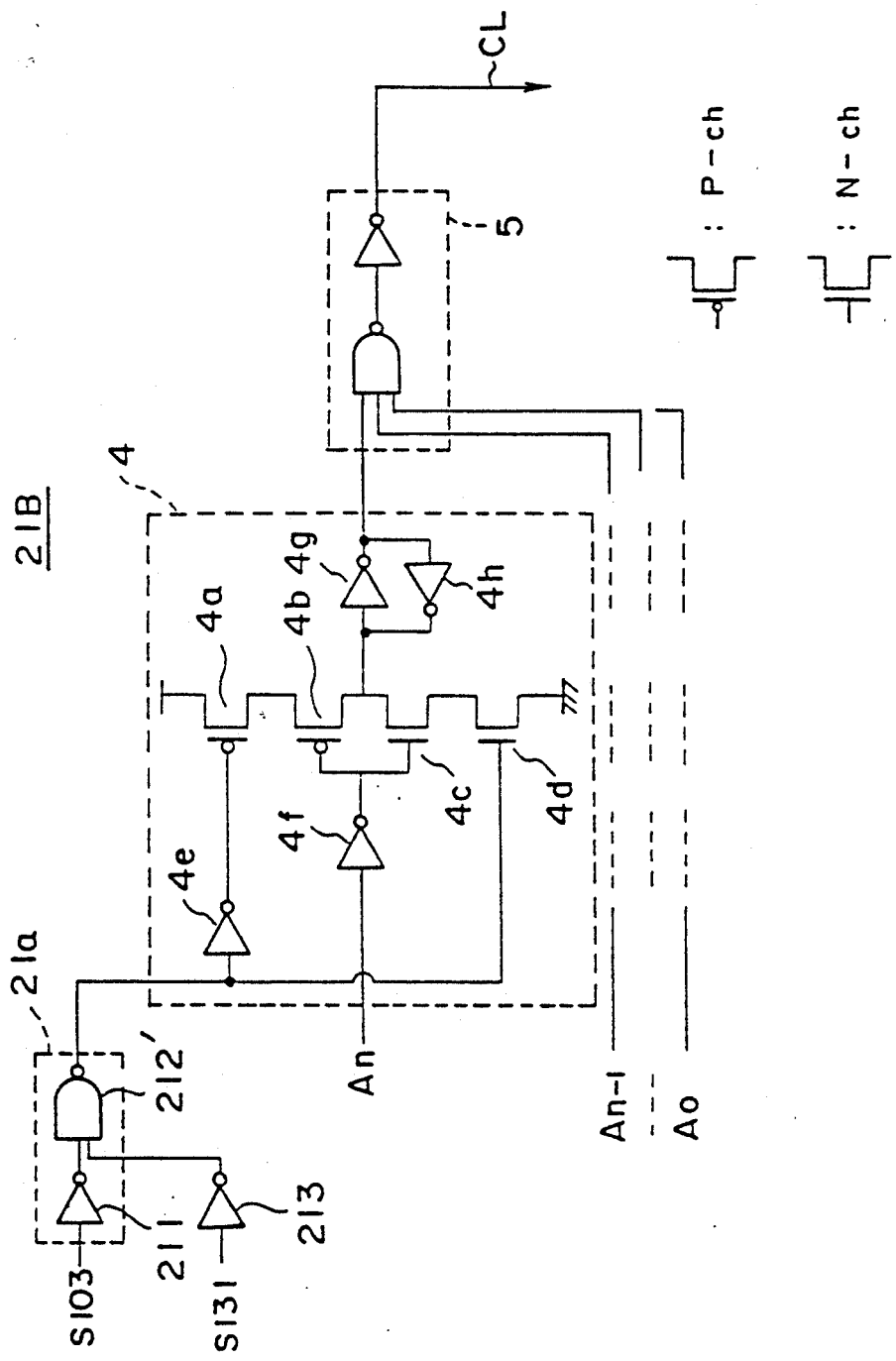

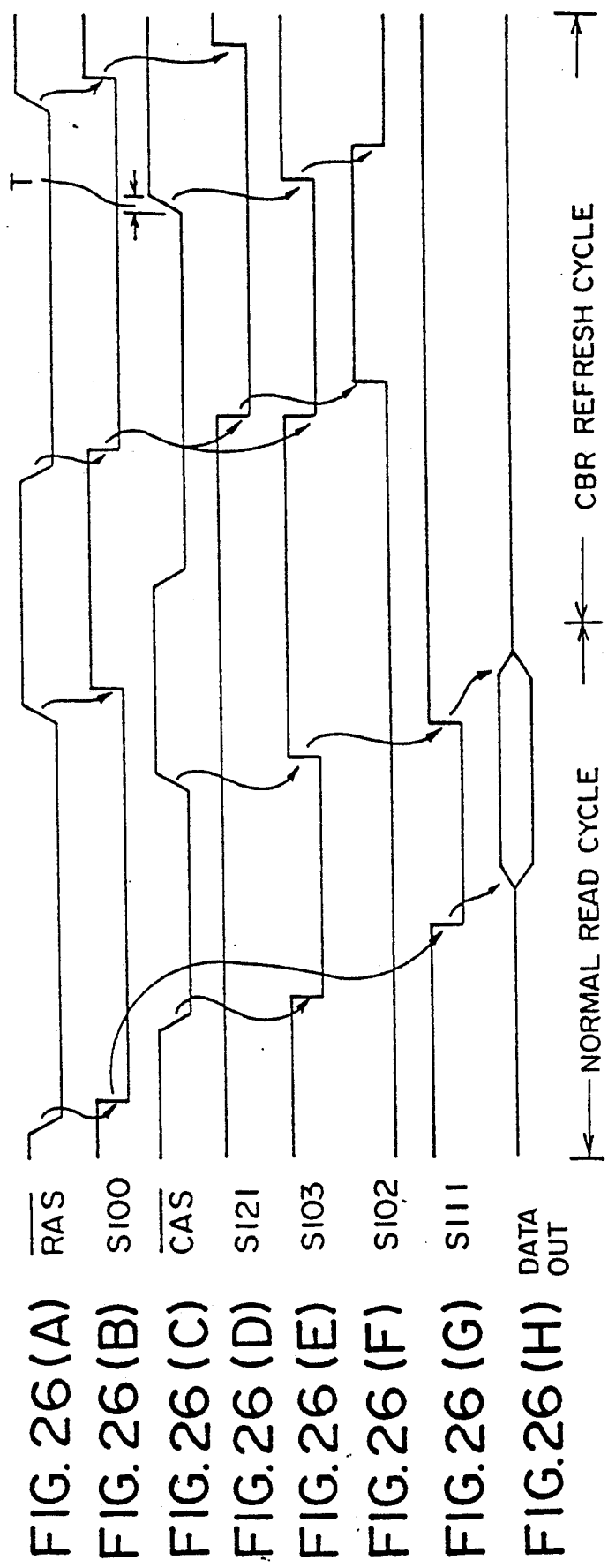

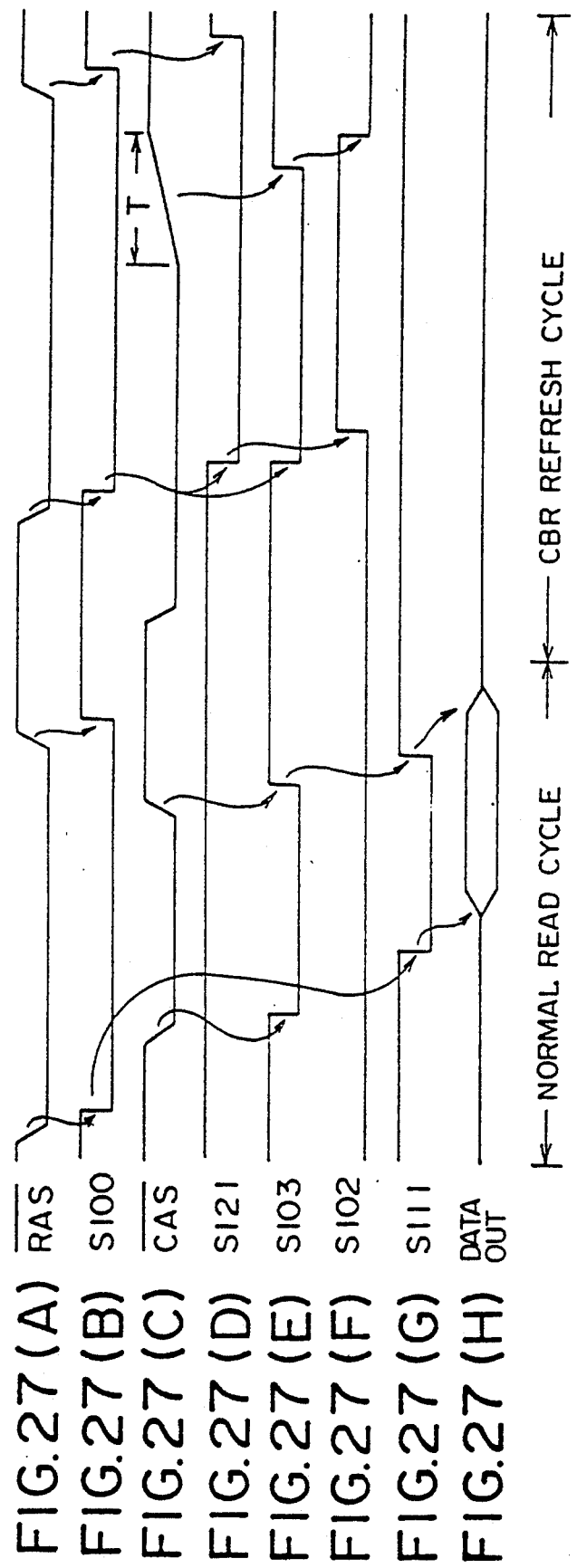

DYNAMIC RANDOM ACCESS MEMORY HAVING AN IMPROVED OPERATIONAL STABILITY

BACKGROUND OF THE INVENTION

The present invention generally relates to memory devices, and more particularly to a dynamic random access memory having an improved operational stability.

Dynamic random access memories store information in a memory cell capacitor in the form of electric charges. The device has a simple semiconductor structure and can be fabricated easily with a very large integration density. Thus, dynamic random access memories are particularly suitable for realizing high-speed, large capacity storage devices.

In dynamic random access memories, it is well known that a refreshing procedure is necessary for maintaining the information. In the refreshing process, the memory cell capacitor is re-charged in compensation for the loss of electric charges that may be caused by the leakage current or other various reasons such as reading. More specifically, the information stored in the memory cell capacitor is detected by a sense amplifier and the sense amplifier re-writes the information into the memory cell capacitor in the form of electric charges.

Typically, such a refreshing cycle is activated by providing a predetermined time relationship between the /RAS signal used for activating the row address selection and the /CAS signal used for activating the column address selection. More specifically, the timing of the /CAS signal is advanced with respect to the timing of the /RAS signal at the beginning of the refreshing cycle, while the end of the refreshing cycle is marked by the trailing edge of the /CAS signal or /RAS signal. Such a procedure is known as CBR (CAS-before-RAS) process. During the refreshing cycle, the output of the memory device is held at a high impedance state such that no output of information occurs. Thus, conventional dynamic random access memories require a complex control system at the peripheral part thereof for effecting the refreshing cycle.

FIG. 1 shows the construction of a conventional dynamic random access memory in the form of a block diagram.

Referring to FIG. 1, the dynamic random access memory includes a row address buffer circuit 1 supplied with multiple-bit address data A0–An for latching the same and a row decoder 2 that selects a word line from a memory cell array 3 based upon the address data latched in the address buffer circuit 1. As usual, the memory cell array 3 includes a number of memory cells 3a arranged in rows and columns, wherein a number of word lines are provided, extending in the row direction. Further, a number of bit lines are provided, extending in the column direction. Further, the illustrated device includes a column address buffer circuit 4 supplied with multiple-bit address data A0–An for latching the same and a column decoder 5 that selects one of the bit lines from the memory cell array 3 based upon the address data latched in the address buffer circuit 4.

In the dynamic random access memories in general, the address data A0–An are supplied to the address buffers 1 and 2 with an address-multiplexing sequence such that the row address data is supplied first and the column address data is supplied after the row address data. Further, in order to distinguish the timing of the row address data and the column address data, a /RAS (row address strobe) signal and a /CAS (column address strobe) signal are supplied externally. In the illustrated example, the /RAS signal is supplied to a RAS control circuit 15 via an input pad 14, while the /CAS signal is supplied to a CAS control circuit 15 via another input pad 16.

Once a word line and a bit line are selected, the data stored in the memory cell at the intersection of the selected word line and the selected bit line is detected by a sense amplifier that is provided in a sense amplifier array 6, and the data thus detected is transferred to an output buffer circuit 8 via a column gate array 7. When writing data, on the other hand, a write enable signal /WE is supplied to a write clock generator 13 via an input pad 12, and a write clock produced by the write clock generator 13 activates an input buffer circuit 11. Thereby, input data $D_{in}$ supplied to an input pad 10 is transferred to the sense amplifier array 6 from the buffer amplifier 11 and is written into the selected memory cell via the column gate array 7.

There, the CAS control circuit 17 not only controls the column decoder 5 but also the write clock generator 13 as well as the output buffer circuit 8 such that the output buffer circuit 8 and the write clock generator 13 are enabled in the normal write cycle. More particularly, the CAS control circuit 17 controls the output buffer circuit 8 such that the output impedance of the circuit 8 becomes high during the refreshing cycle.

In such a control operation of the CAS control circuit 17, various thresholding processes are included to discriminate the logic level of the /RAS signal and the /CAS signal. Conventionally, there has been a problem in that, depending on the sharpness of the leading and trailing edges of the /RAS signal and the /CAS signal, the timing of enabling and disabling of the buffer circuit 8 may be changed. In the worst case, such a deviation in the operational timing can lead to a premature enabling of the buffer circuit 8 while the refreshing cycle is still continuing. Hereinafter, this problem will be examined in detail with reference to FIG. 2 showing a part 18 of the circuit of FIG. 1.

Referring to FIG. 2, the circuit 18 includes a first stage circuit 19 for producing a control signal S100 the waveform of which is shown in FIGS. 4(A) and 4(B), in response to the /RAS signal and with a predetermined timing relative to the /RAS signal. The control signal S100 is supplied on the one hand to a circuit 20 that produces a control signal S101 shown in FIGS. 6(A)–6(D) and on the other hand to a circuit 22 that produces a control signal S103 shown in FIGS. 9(A)–9(F), wherein the control signal S103 is supplied from the circuit 20 to an address control circuit 21A together with the control signal S100, and the address control circuit 21A activates the column address buffer circuit 4 and the column decoder 5. The circuit 22, on the other hand, controls the output buffer circuit 8 by the control signal S103 that is supplied to an output control circuit 25.

Further, the circuit 19 supplies the control signal S100 to a circuit 23A that is provided for detecting the commencement of a refreshing cycle, and the circuit 23A supplies an output control signal S121 to a control circuit 24A that produces an output control signal S102 for controlling the output control circuit 25. Thus, the output control circuit 25 is supplied with the control signals S103 and S102 respectively from the circuits 22 and 24A and further with the control signal S100 from the circuit 19, and controls the operation of the output buffer circuit 8 such that the output buffer circuit 8, is at a high impedance state during the refreshing cycle.

FIG. 3 shows the construction of the circuit 19 and FIGS. 4(A) and 4(B) show the timing of producing the output signal S100 in response to the /RAS signal.

Referring to FIG. 3, the circuit 19 includes inverters 26 and 27 connected in series to the input pad 14 such that the /RAS signal supplied to the input pad 14 is delayed by a predetermined time interval that is determined by the number of stages of the inverters. In the illustrated example, two inverters 26 and 27 are used. Thereby, the output control signal S100 is produced in response to the /RAS signal with a predetermined delay therefrom.

FIG. 5 shows the construction of the circuit 20, wherein the circuit 19 is illustrated together by a broken line.

Referring to FIG. 5, the circuit 20 includes a NOR gate 28 and an inverter 29 cascaded with each other, wherein the output signal S100 of the circuit 19 is supplied to a first input terminal of the NOR gate 28 and the /CAS signal at the input pad 16 is supplied to a second input terminal of the NOR gate 28. The output of the NOR gate 28 is inverted in the inverter 29 and forms the output control signal S101 with a timing as indicated in FIG. 6(D). Thus, the signal S101 is at a low level state when both the signal S100 and /CAS have the low level state.

FIG. 7 shows the construction of the address control circuit 21A, wherein it will be noted that the address control circuit 21A includes a circuit 21a that in turn is formed of inverters 211 and 212 cascaded with each other, and the output of the circuit 21a is supplied to the address buffer circuit 4 that includes transistors 4a–4d connected in series between two power supply voltage sources wherein the transistors 4a and 4b are formed of a P-channel MOS transistor while the transistors 4c and 4d are formed of an N-channel MOS transistor. The output of the circuit 21a is supplied directly to the gate of the transistor 4d and further to the gate of the transistor 4a after inversion by an inverter 4e. Further, an address signal An is supplied to the gate of the transistors 4b and 4c after inversion in an inverted 4f. The output of the transistor circuit is obtained at an intermediate node between the transistors 4b and 4c and is latched by a latch circuit formed of inverters 4g and 4h. The output of the address buffer circuit 4 is then supplied to the column decoder 5 that is formed of a multiple input NAND gate 5a and an inverter 5b cascaded thereto, wherein the address data of other address bits such as $A_{n-1}, \ldots A_0$ are supplied to the gate 5a. The output of the inverter 5b is outputted on the column line CL as usual.

FIG. 8 shows the construction of the circuit 22 for producing the control signal S103 for controlling the activation of the output buffer circuit 8, wherein the circuit 22 includes a NAND gate 30, a NOR gate 21 and inverters 32 and 33 connected to form a flip-flop circuit, wherein the NAND gate 30 and the inverter 32 are connected in series to produce an signal S02, and the signal S02 thus produced is supplied to the NOR gate 31 that is connected in series to the inverter 33. The inverter 33 in turn produces a signal S01 that is fed back to the NAND gate 30. Further, the control signal S100 is supplied to the NAND gate 30 from the circuit 19 in response to the /RAS, while the /CAS signal is supplied from the input pad 16 to the NOR gate 31. Thus, the output signal S103 is produced by the signal S01 that has passed consecutively through inverters 34 and 35 that in turn are provided for the timing adjustment.

FIGS. 9(A)–9(F) show the operation of the circuit 22, a timing control circuit for producing the output control signal S103 in response to the /RAS and /CAS signals represented in FIGS. 9(A) and 9(B) as well as the signal S100 represented in FIG. 9(C), wherein it will be noted that the signal S01 undergoes a transition to the low level state in response to the leading edge of the /CAS signal and an opposite transition to the high level state in response to the trailing edge of the same /CAS signal, provided that the level of the signal S02 is held at the low level state in correspondence to the normal read cycle of the dynamic random access memory. On the other hand, when the level of the signal S02 is high in correspondence to the initial period of the refreshing cycle, the signal S01 does not undergo a transition immediately to the low level state even when the /CAS signal has undergone a transition to the low level state. Only when the signal S02 has undergone a transition to the low level state in correspondence to the transition of the /RAS signal that in turn occurs in correspondence to the refreshing cycle, the signal S01 undergoes a transition to the low level state. The signal S01 further undergoes another transition to the high level state in correspondence to the transition of the /CAS signal to the high level state.

On the other hand, the signal S02 experiences a transition to the low level state in the normal read cycle in response to the transition of the /RAS signal, and hence the signal S100 also experiences a transition to the low level state, irrespective of the state of the signal S01, wherein the low level state of the signal S02 continues until the signal S01 undergoes a transition to the high level state. Further, in the refreshing cycle, the signal S02 undergoes a transition to the low level state in response to the leading edge of the /RAS signal and maintains the low level state until the /RAS signal returns to the high level state.

In correspondence to the signal S01, the output control signal S103 is produced as indicated in FIG. 9(F), as a signal identically shaped as signal S01 but delayed therefrom by the timing of the inverters 34 and 35. The control signal S103 thereafter supplied to the circuit 25 for controlling the output buffer circuit 25, as already noted, wherein the output buffer circuit 8 is activated in response to the low level interval of the signal S103, while the same output buffer circuit 8 is deactivated in response to the high level state of the signal S103. During the high level state of the control signal S103, the output buffer circuit 8 exhibits a high output impedance state.

Next, the circuit 23A of FIG. 2 for detecting the CBR refreshing cycle will be described with reference to FIG. 10.

Referring to FIG. 10, the circuit 23A includes an inverter 23a, a NAND gate 23b connected in series to the inverter 23a for receiving an output signal U01 therefrom along a first path, an inverter 23c interposed in another path extending from the inverter 23a to the NAND gate 23b, an inverter 23d connected to the NAND gate 23b for inverting an output signal U02 of the gate 23b to produce an output signal U03, a NAND gate 23e supplied with the signal U03 and the signal S101 via an inverter 23f wherein the inverter 23f produces an output signal U07 as a logic inversion of the signal S101. Thereby, the NAND gate 23e produces an output signal U05, and the signal U05 is supplied to a NAND gate 23g that forms a flip-flop circuit together with another NAND gate 23h to which the output signal U07 of the inverter 23f is supplied. In the flip-flop circuit, the NAND gate 23g produces an output signal U06 that is supplied to the NAND gate 23h, and the NAND gate 23h produces an output control signal S121 that indicates the commencement of the CBR refreshing cycle.

Next, the operation of the circuit 23A will be described in detail with reference to FIGS. 11(A)–11(K), wherein FIGS. 11(A)–11(C) represent the signals /RAS, /CAS and S100, respectively.

It will be noted that the signal U01 experiences a transition to the high level state in correspondence to the leading edge of the signal s100 and returns to the low level state in response to the trailing edge of the signal S100, wherein the leading edge and trailing edge of the signal S100 correspond to the leading edge and trailing edge of the /RAS signal. Further, the signal U02 causes a momentary transition to the low level state in correspondence to the leading edge of the signal U01. Further, the signal U03 is produced as a logic inversion of the signal U02, and the signal U07 is produced as a logic inversion of the signal S101.

Further, the signal U05 experiences a transition to the low level state in response to the leading edge of the signal S100 and a transition to the high level state in response to the trailing edge of the /CAS signal or the trailing edge of the /RAS signal, whichever comes first. Thus, when the trailing edge of the /CAS signal, comes before the trailing edge of the /RAS signal as indicated in the drawing by "A," the signal U05 is reset in response to the trailing edge of the /CAS signal. In addition when the trailing edge of the /RAS signal appears before the trailing edge of the /CAS signal, as indicated by "B," the signal U05 is reset in response to the trailing edge of the /RAS signal. Further, the signal U06 experiences a transition to the high level state in response to the leading edge of the signal U05 and a transition to the low level state in response to the trailing edge of the signal U05. Thereafter, the output signal S121 is obtained in correspondence to the signal U06.

It should be noted in FIGS. 11(A)–11(K) that the signal S121 is not produced in the normal read write cycle. This is because the signal S101 takes a high level state in the normal read cycle when the signal U03 has caused the transition in response to the signal S100. In other words, the signal S121 is produced only when the /CAS signal has preceded the /RAS signal. Further, the signal S121 is reset by the trailing edge of the /CAS signal, or /RAS signal whichever appears first.

Next, the construction of the CBR control circuit 24A will be described with reference to FIG. 12.

Referring to FIG. 12, the circuit 24A includes a number of inverters 24a–24f cascaded in series, and the inverter 24f supplies an output signal to a NAND gate 24g. Further, an output V01 of the inverter 24c included in the cascaded inverters is supplied directly to the NAND gate 24g as another input signal, and the NAND gate 24g produces an output signal V02 as a result of the logic combination of the output of the inverter 24f and the output of the inverter 24c. The output of the NAND gate 24g in turn is supplied to a NAND gate 24h that forms a flip-flop circuit together with a NAND gate 24i, wherein the NAND gate 24i is supplied with an output signal V03 that is produced by an inverter 24g in response to the control signal S101. In the flip-flop circuit, the NAND gate 24h produces the output signal S102 and the signal S102 thus produced is fed back to the NAND gate 24i. The NAND gate 24i in turn produces an output signal V04 and supplies the same to the NAND gate 24h.

FIGS. 13(A)–13(J) show the operation of the CBR control circuit 24A, wherein FIGS. 13(A) and 13(B) show the waveform of /RAS signal and /CAS signal, while FIG. 13(C) shows the waveform of the signal S100 and FIG. 13(D) shows the waveform of the signal S121. Further, FIG. 13(E) shows the waveform of the signal S101. In addition, FIGS. 13(F)–13(I) show the waveform of the signals V01–V04, respectively, and FIG. 13(J) shows the waveform of the signal S102.

Referring to the drawings, the signals S100, S121 and S101 are produced with the timing sequence already described, and the signal V01 is produced as a logic inversion of the signal S121 with a predetermined delay therefrom. Further, the signal V02 is produced in correspondence to the leading edge of the signal V01 and continues for an interval determined by the delay caused by the inverters 24d–24g. The signal V03 is produced as a logic inversion of the signal S101. Moreover, the signal V04 is produced in response to the signals V03 and S102 and undergoes a transition to the low level state in response to the leading edge of the signal S102. Further, the signal S102 is produced in response to the leading edge of the signals V02 and V04. There, the signal V04 maintains the low level state until the signals V03 and S102 undergoes a transition to the low level state. Similarly, the signal S102 maintains the high level state until the signal V04 causes a transition to the low level state.

As indicated in FIGS. 13(A)–13(J), the trailing edge of the signals S102 is determined by the timing of the trailing edge of the /CAS signal or the /RAS signal whichever comes first. Thus, as indicated in "A" in FIGS. 13(A)–13(J), the control signal S102 is reset in response to the timing of the trailing edge of the /CAS signal when the /CAS signal ends before the /RAS signal. Similarly, the reset of the control signal S102 occurs in response to the trailing edge of the /RAS signal, as indicated by "B" in the figures in the case when the trailing edge of the /RAS signal causes before the trailing edge of the /CAS signal.

Next, the circuit 25 for controlling the output buffer circuit 8 in response to the control signals S100, S102 and S103 will be described with reference to FIG. 14.

Referring to FIG. 14, the circuit 25 includes an inverter 25a supplied with the output control signal S100 for inverting the same to produce an output signal W01, wherein the signal W01 is supplied to a NAND gate 25b. Further, inverter 25c is supplied with the control signal S102 and produces a signal W02 as a logic inversion thereof. The signals W01 and W02 are supplied to a NAND gate 25b, wherein the NAND gate 25b produces an output signal W03 and supplies the same to an inverter 25d that produces an output signal W04 as a logic inversion of the signal W03. The signal W04 is then supplied to another NAND gate 25e that is further supplied with a signal W05 from an inverter 25f as a logic inversion of the signal S103. Thereby, the NAND gate 25e produces an output that is passed through an inverter 25g to form a control signal S111. The signal S103 is further supplied to a NOR gate 25h that is also supplied with the same signal S103 but with a delay caused by inverters 25i and 25j, wherein the gate 25h produces a control signal S112.

The control signals S111 and S112 are used for controlling the output buffer circuit 8 of which construction is shown in FIG. 15.

Referring to FIG. 15, the circuit 15 includes a NAND gate 8a supplied with the control signals S111 and S112 to produce a signal X01 which is inverted subsequently by an inverter 8b to produce a signal X02. The signal X02 in turn is supplied to a transfer gate 8c formed of an N-channel MOS transistor and causes a transfer of data S141 outputted from a sense amplifier in the sense amplifier array 6 to a NAND gate 8d as a signal X11 in response to the high level state of the signal X02. The NAND gate 8d is supplied with the signal S112 in addition to the signal X11 and produces a signal X12 that is latched by a flip-flop circuit formed by the gate 8d and a feedback path 8e. The output signal X12 of the gate 8d is supplied to a gate of an N-channel MOS transistor 8g for controlling the conduction thereof.

Further, the data S141 is supplied to another transfer gate 8i after passing through an inverter 8h, wherein the transfer gate 8i is formed of an N-channel MOS transistor similarly to the transistor 8c and is activated in response to the control signal X02 from the inverter 8b. Thus, the data that has passed through the transfer gate 8i is represented as a signal X21, wherein the signal X21 is supplied to a NAND gate 8j which is also supplied with the control signal S112. Again, the NAND gate 8j has a feedback path provided by an inverter 8k and forms a flip-flop circuit for latching the signal X21. The NAND gate 8j thereby produces an output signal X22 that is inverted subsequently in an inverter 8l with respect to the logic state thereof to form a signal X23 that is supplied to a gate of another N-channel MOS transistor 8m. There, the transistors 8g and 8m are connected in series between the voltage sources Vcc and Vss, and the output of the buffer circuit 8 is obtained at the output pad 9 that is connected to an intermediate node between the transistors 8g and 8m.

It should be noted that the low level state of the signal S111 causes a turning off of transfer gate transistors 8c and 8i, and the flip-flop circuit formed of the circuits 8c and 8e as well as the flip-flop circuit formed of the circuits 8j and 8k continue outputting the signals X12 and X22, provided that the signal S112 takes the high level state. When the signal S111 is in the high level state, on the other hand, the data signal S141 is supplied to the flip-flop circuits and is latched therein.

When the signal S112 has caused a transition to the low level state, on the other hand, the data latching by the flip-flop circuit is deactivated and the output signals X12 and X22 are both urged to the high level state. Thereby, the transistors 8g and 8m are both turned off and the output of the buffer circuit 8 takes the high impedance state. In summary, the output buffer circuit 8 outputs data when the signal S112 is in the high level state. When the signal S112 is in the low level state, the buffer circuit 8 shows the high impedance state.

Next, the operation of the circuit 25 will be described with reference to FIGS. 16(A)-16(L), wherein FIGS. 16(A) and 16(B) show the /RAS signal and the /CAS signal respectively, FIGS. 16(C)-16(E) show the control signals S100, S102 and S103 respectively, FIGS. 16(F)-16(J) show the signals W01, W02, W03, W04 and W05 respectively, and FIGS. 16(K) and 16(L) show the signals S111 and S112, respectively.

Referring to FIGS. 16(A)-16(L), the signal W01 corresponds to the signal S100 and undergoes a transition to the high level state and a transition to the low level state in response to the leading edge and the trailing edge of the signal S100. Similarly, the signal W02 corresponds to the signal S102 and undergoes a transition in response thereto. The signal W03 thereby causes a transition in response to the signal W01 and exhibits a low level state in the normal read cycle in correspondence to the high level state of the signal W01. Further, the signal W03 causes a momentary transition to the low level state in the CBR refreshing cycle in response to the interval after the signal W01 has undergone a transition to the high level state but before the signal W02 changes to the low level state. In response the signal W03, the signal W04 is produced as a logic inversion. Referring to FIGS. 16(H) and 16(I), it will be noted that the momentary transition of the signal W03 and hence the signal W04 occurs twice, the first during the interval in which the /CAS signal is low and the second during the interval after the /CAS signal has returned to the high level state.

The signal W05 represents a logic inversion of the signal S103 and controls the gate 25e such that the signal W04 is selectively passed therethrough in response to the high level interval of the signal W05. Thereby, the signal W04 that has passed through the gate 25e is passed further through the inverter 25g to form the signal S111. There, it will be noted that the signal S111 includes a high level state in correspondence to the /CAS signal in the normal read cycle and a momentary high level state in the CBR refreshing cycle in correspondence to the high level state of the signals W03 and W04. It should be noted that the signal S111 causes a latch operation of the output buffer circuit 8 in response to the low level state, while the latch is released in response to the high level state of the signal S111.

The signal S112 in turn is produced in response to the transition of the signal S103 that in turn is caused by the transition of the /CAS signal in the normal read cycle. In the CBR refreshing cycle, on the other hand, the signal S103 undergoes a transition to the low level state in response to the leading edge of the /RAS signal and a subsequent transition to the high level state in response to the trailing edge of the /CAS signal. Thereby, the signal S112 is also activated to the high level state in response to the leading edge of the /RAS signal and deactivated to the low level state in response to the trailing edge of the /CAS signal.

Referring to FIGS. 16(K) and 16(L) again, it will be noted that there exists a moment wherein the signals S111 and S112 are both high in the normal read cycle and the data output occurs in response to such a timing sequence wherein the signals S111 and S112 are both high. On the other hand, such a state does not exist in the refreshing cycle. There, the signal S111 causes a transition to the high level state momentarily in correspondence to the signals W03 and W04 before the signal S112 undergoes a transition to the high level state. However, such a transition of the signal S111 during in the low level interval of the signal S112 does not cause the data output and the output buffer circuit 8 remains in the high impedance state. When the signal S112 has caused a transition to the high level state subsequently to the momentary transition of the signal S111, on the other hand, the signal S111 is low in the high level interval of the signal S112, and the signals X12 and X22 are latched at the low level state. Thereby, the transistors 8g and 8m are both turned off and the output of the buffer circuit 8 is held also at the high impedance sate.

Therefore, data output is prohibited during the refreshing cycle of the device.

On the other hand, there is a possibility that the signal S102 experiences a premature transition to the low level state when the /CAS signal rises gradually. Hereinafter, the problem of the conventional circuit described heretofore will be examined with reference to FIGS. 17(A)-17(L) showing the waveform of the signals shown in FIGS. 16(A)-16(L) for the case where the /CAS signal rises slowly as indicated in FIG. 17(B). Such a slow rise of the /CAS signal may be caused for example by the parasitic capacitance of the wiring used for transferring the /CAS.

It is important to note that the signal S111 undergoes a transition to the high level state in response to the leading edge of the signal W04, provided that the signal W05 maintains the high level state. See the circuit diagram of FIG. 14. There, such a transition of the signal W04 to the high level state can be induced not only in response to the leading edge of the /RAS signal but also in response to the trailing edge of the /CAS signal, as already noted in FIG. 16(I). In the normal operation of the device as represented in FIGS. 16(A)-16(L), it will be noted that the high level state of the signal W04 occurring in response to the trailing edge of the /CAS signal does not cause the output of the signal S111 because of the low level state of the signal W05. In the example of FIGS. 17(A)-17(L) on the other hand, the output of the signal S111 occurs because of the premature transition of the signal S102 in response to the gradual increase of the /CAS signal level, as shown in FIGS. 17(B) and 17(D). Therefore, an unwanted data output occurs during the CBR refreshing cycle and the operational specification of the dynamic random memory device for maintaining the output the output buffer amplifier at the high impedance state during the refreshing cycle is no longer satisfied.

The foregoing analysis of operation of various parts of the memory device of FIG. 2 indicates that the cause of the undesirably result is attributed to the independently conducted thresholding operation for detecting the trailing edge of the /CAS signal in the circuit 24A and in the circuit 22. Thus, the circuit 24A produces the signal S102 based upon the signal S101 that in turn is produced in the circuit 20, while the signal S103 is produces in the circuit 22. Therefore, when the signals S102 and S103 are produced based upon the same thresholding operation of the /CAS signal, the deviation of timing between the signal S102 and the signal S103 would be eliminated and the problem of undesirable data output during the CBR refreshing cycle will also be eliminated.

SUMMARY OF THE INVENTION

Accordingly, it is a general object of the present invention to provide a novel and useful random access memory wherein the foregoing problems are eliminated.

Another and more specific object of the present invention is to provide a dynamic random access memory wherein the problem of undesirable data output during the refreshing cycle is eliminated.

Another object of the present invention is to provide a dynamic random access memory, comprising: a plurality of memory cells each storing information in the form of electric charges, said memory cells being arranged to form a memory cell array; addressing means supplied with address data for selecting a memory cell from said memory cell array; input/output means for writing and/or reading information to and from said selected memory cell; and control means for controlling said addressing means and input/output means such that said input/output means shows a high impedance state during a refreshing cycle of said memory cells, wherein said control means comprises: first input means supplied with a first timing signal for outputting a first control signal in response thereto; second input means supplied with a second, different timing signal for outputting a second control signal in response thereto, said first timing signal and second timing signal being given with a timing such that a read/write cycle for writing and reading information to and from the selected memory cell is achieved when said first timing signal precedes said second timing signal and such that a refreshing cycle for refreshing said memory cells is achieved when said second timing signal precedes said first timing signal; a timing control circuit supplied with said first and second control signals from said first and second input means respectively for producing a third control signal in response thereto such that said third control signal is produced in response to a leading edge of said second control signal and terminates in response to a trailing edge of said second control signal when in said read/write cycle and such that said third control signal is produced in response to a leading edge of said first control signal and terminates in response to a trailing edge of said second control signal when in said refreshing cycle; a detection circuit supplied with said first and second control signals from said first and second input means respectively for producing a fourth control signal when the timing of said second control signal has preceded the timing of said first control signal in correspondence to said refreshing cycle; a refresh control circuit supplied with said third control signal from said timing control circuit and further with said fourth control signal from said detection circuit for producing a fifth control signal such that said fifth control circuit is produced in correspondence to an interval extending from a timing a corresponding to the leading edge of said fourth control signal to a timing corresponding to the trailing edge of said third control signal; an output control circuit supplied with said third control signal from said timing control circuit concurrently to said refresh control circuit and further with said fifth control signal from said refresh control signal for producing sixth and seventh control signals such that said sixth control signal is produced only in said read/write cycle in correspondence to an interval extending from a timing corresponding to the leading edge of said third control signal to a timing corresponding to the trailing edge of said third control signal and such that said seventh control signal is produced in said read/write cycle in correspondence to an interval extending from a timing corresponding to the leading edge of said third control signal to a timing corresponding to the trailing edge of said third control signal and further in said refreshing cycle in an interval extending from a timing corresponding to the leading edge of said fifth control signal to a timing corresponding to the trailing edge of said fifth control signal, with a timing such that said seventh control signal does not overlap with said sixth control signal; said output control circuit controlling said input/output means by said sixth and seventh control signals such that a reading and/or writing of information to and from a selected memory cell is allowed only when said sixth and seventh control signals are provided simultaneously, said output control circuit further controlling said input/output means such that said input/output means shows a high output impedance state when said seventh control signal is not provided.

According to the present invention, the problem caused by the independently conducted thresholding operation for detecting the trailing edge of the /CAS signal in the circuit 24A and in the circuit 22 is successfully eliminated by using the third control signal produced by the timing control circuit commonly in the refresh control circuit and the output control circuit. As the timing of the trailing edge of the third control signal is uniquely determined by the trailing edge of the /CAS signal, and as the trailing edge of the fifth control signal is uniquely determined by the trailing edge of the third control signal, there is no ambiguity in the timing relationship between these control signals and the unwanted data output as explained with reference to FIG. 17(L) is avoided. Further, the output impedance of the input/output means is maintained in the high level state throughout the refreshing cycle.

Other objects and further features of the present invention will become apparent from the detailed description when read in conjunction with the attached drawings.

BRIEF DESCRIPTION OF THE DRAWINGS

FIG. 23 is a block diagram showing a part of the control system of FIG. 18;

FIGS. 24(A)-24(B) are diagrams showing the operation of the circuit of FIG. 23;

FIG. 25 is a circuit diagram showing the construction of the address control circuit used in the system of FIG. 18.

FIGS. 26(A)-26(H) are diagrams showing the overall operation of the control system of FIG. 18; and FIGS. 27(A)-27(H) are diagrams showing the overall operation of the control system of FIG. 18 in another situation.

DETAILED DESCRIPTION OF THE PREFERRED EMBODIMENTS

Figure 1:
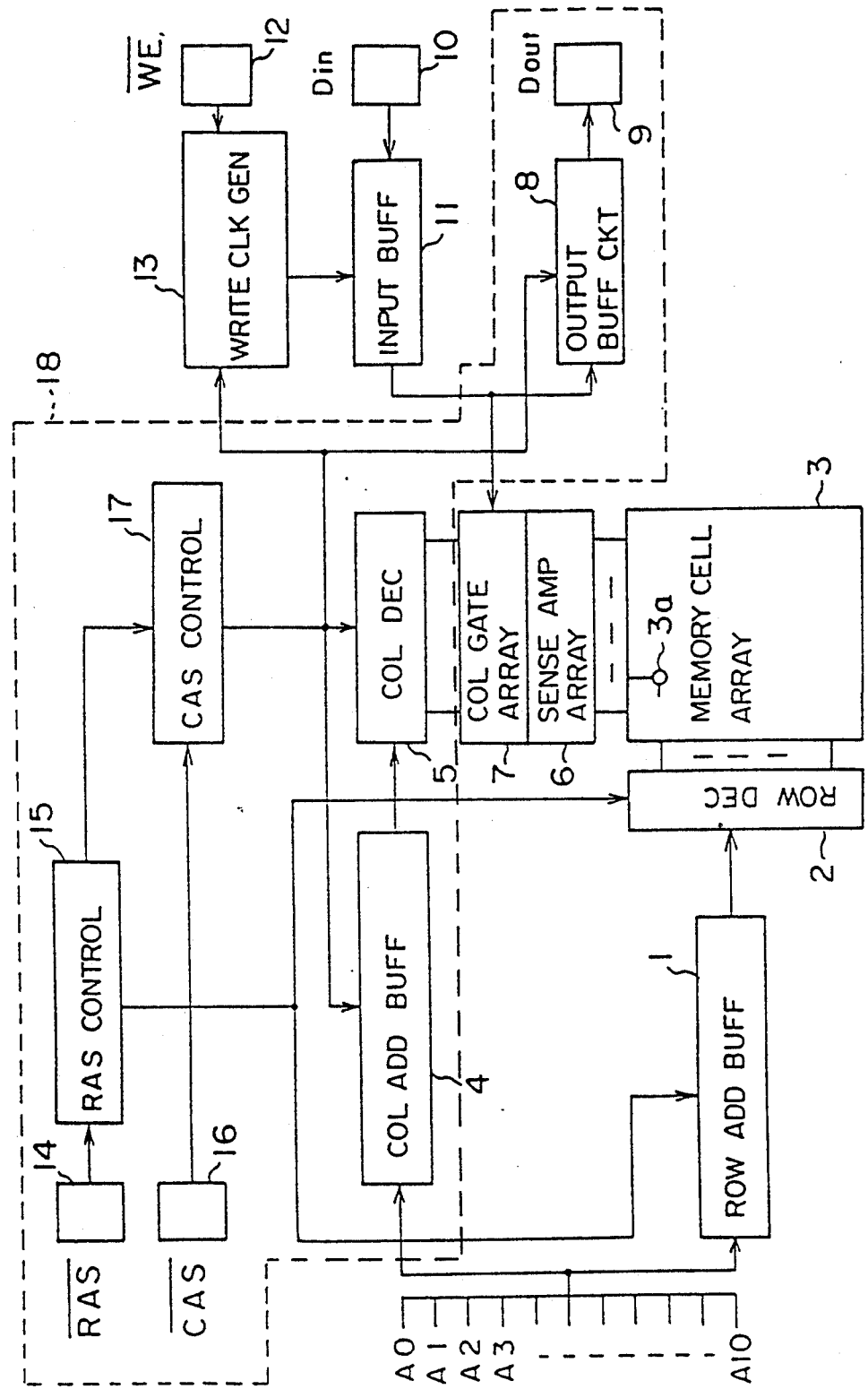
FIG. 1 is a block diagram showing the overall construction of a conventional dynamic random access memory.
Figure 18:
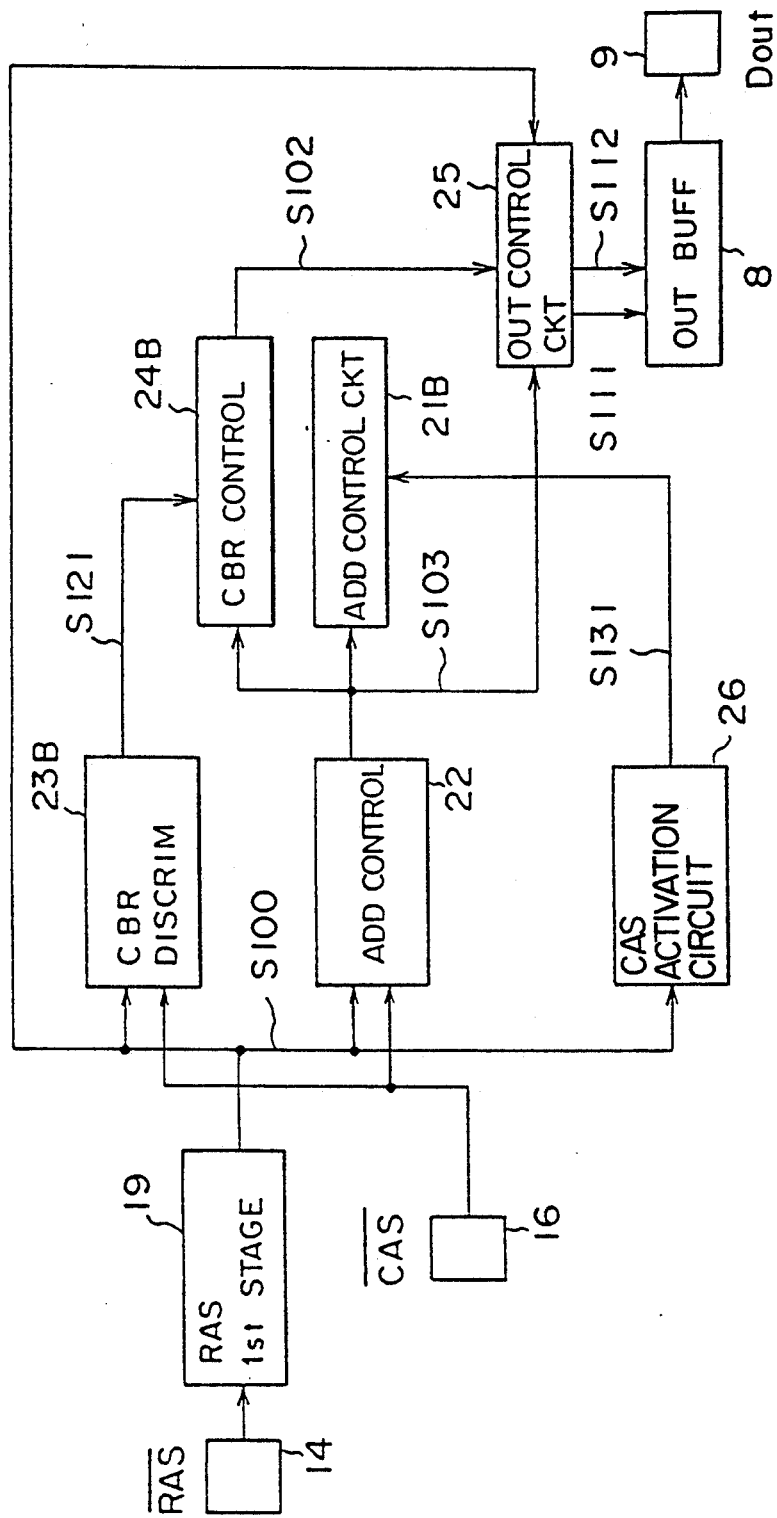
FIG. 18 is a block diagram showing the construction of a control system used in the dynamic random access memory shown in FIG. 1, according to a first embodiment of the present invention.

FIG. 18 shows the construction of a control circuit according to a first embodiment of the present invention, wherein the circuit of FIG. 18 is used in the dynamic random access memory of FIG. 1 in place of the circuit 18. In other words, the circuit of FIG. 18 replaces the circuit of FIG. 2. In the description hereinafter, those parts that are constructed identically with those parts described already with reference to the previous drawings are designated by the same reference numerals, and the description thereof will be omitted.

Figure 2:
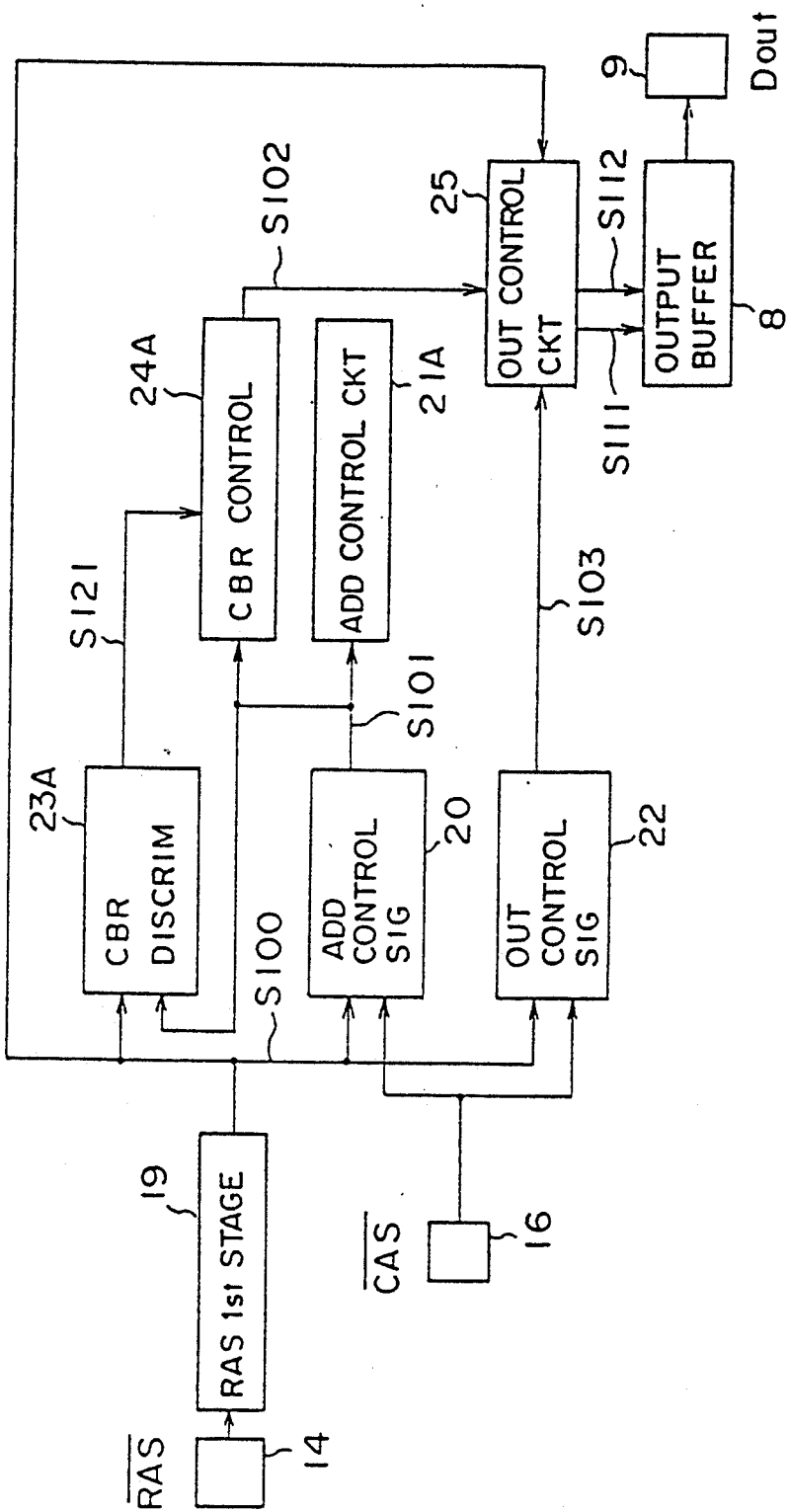
FIG. 2 is a block diagram showing a conventional control system used in the dynamic random access memory of FIG. 1.
Figure 3:
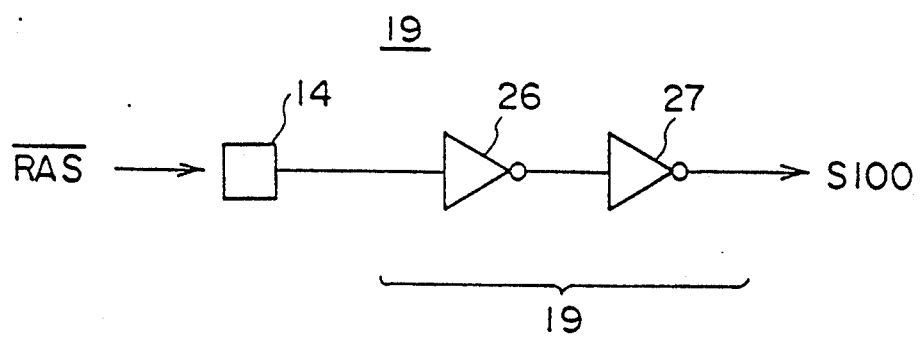
FIG. 3 is a block diagram showing a part of the control system of FIG. 2.
Figure 4:
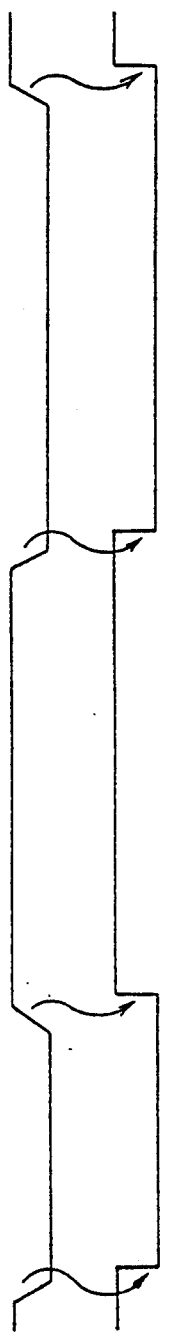
FIGS. 4(A) and 4(B) are diagrams showing the operation of the circuit of FIG. 3.
Figure 5:
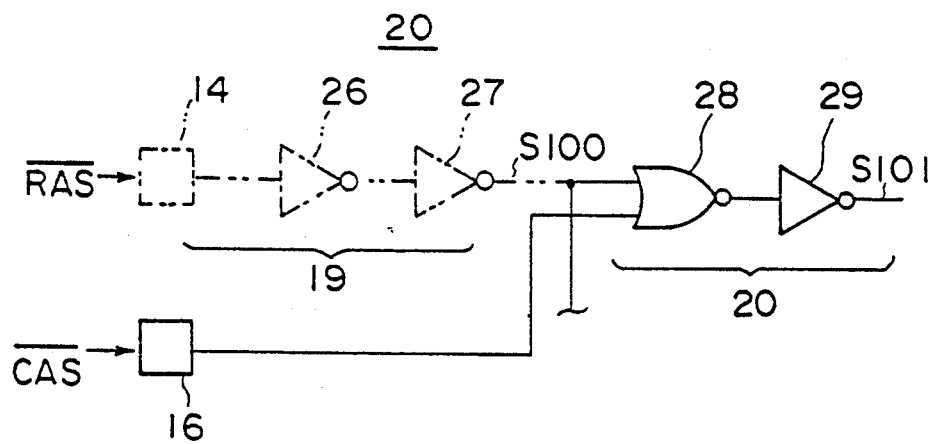
FIG. 5 is a block diagram showing a part of the control system of FIG. 2.
Figure 6:
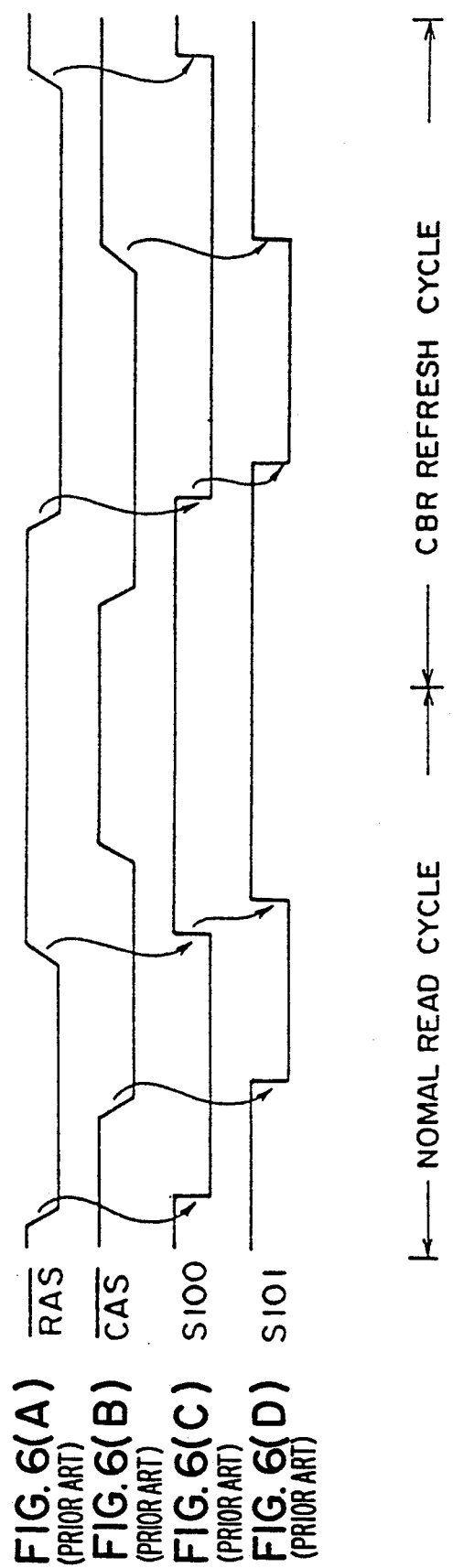
FIGS. 6(A)-6(D) are diagrams showing the operation of the circuit of FIG. 5.
Figure 7:
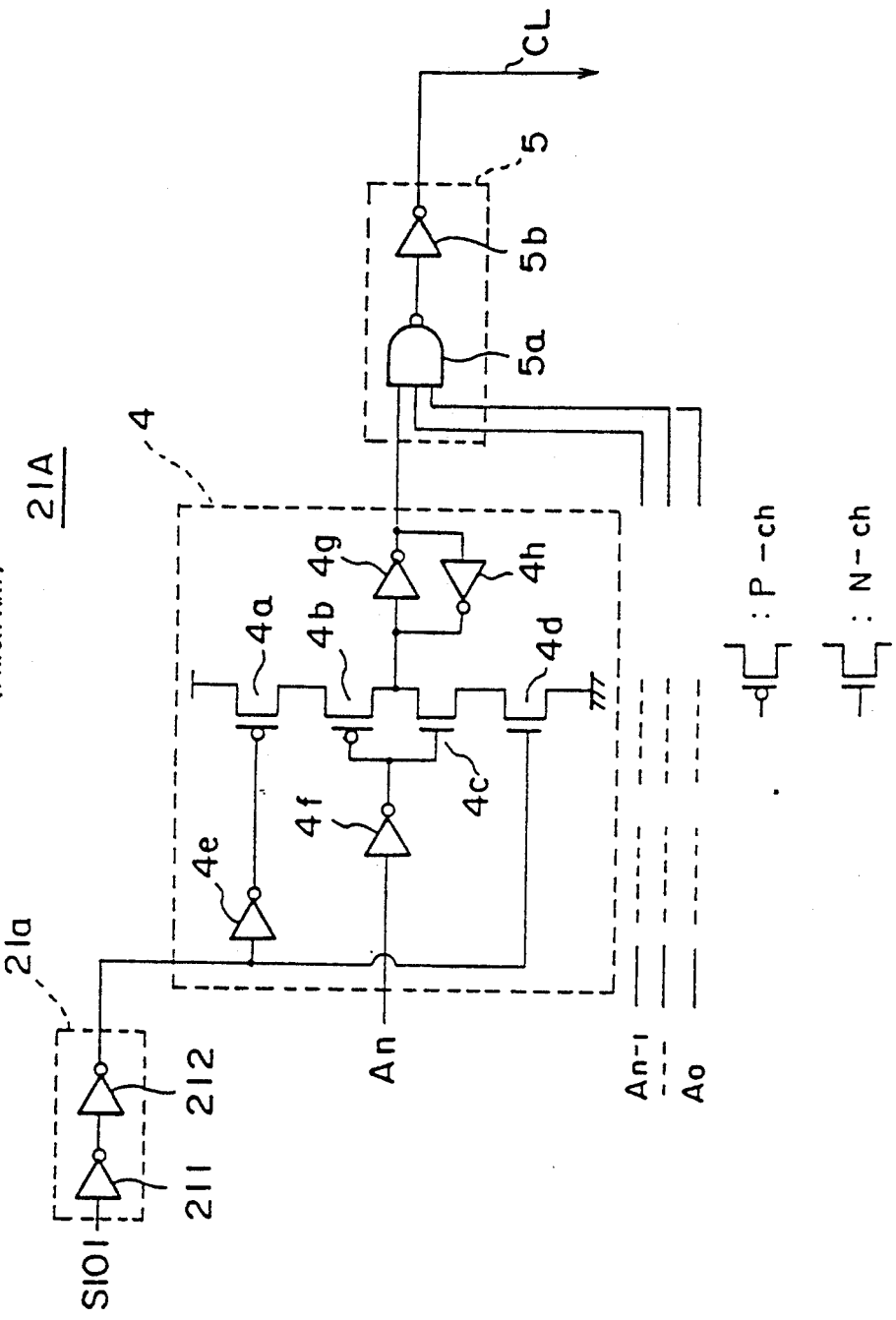
FIG. 7 is a block diagram showing a part of the control system of FIG. 2.
Figure 8:
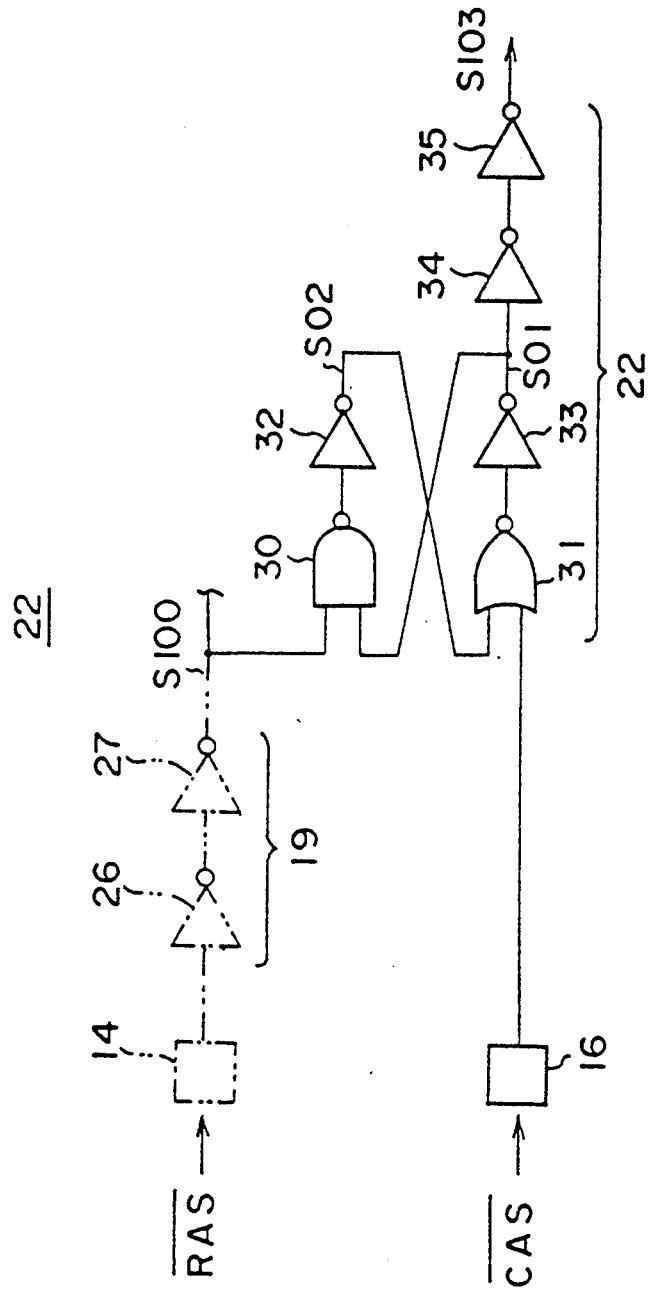
FIG. 8 is a block diagram showing a part of the control system of FIG. 2.
Figure 9:
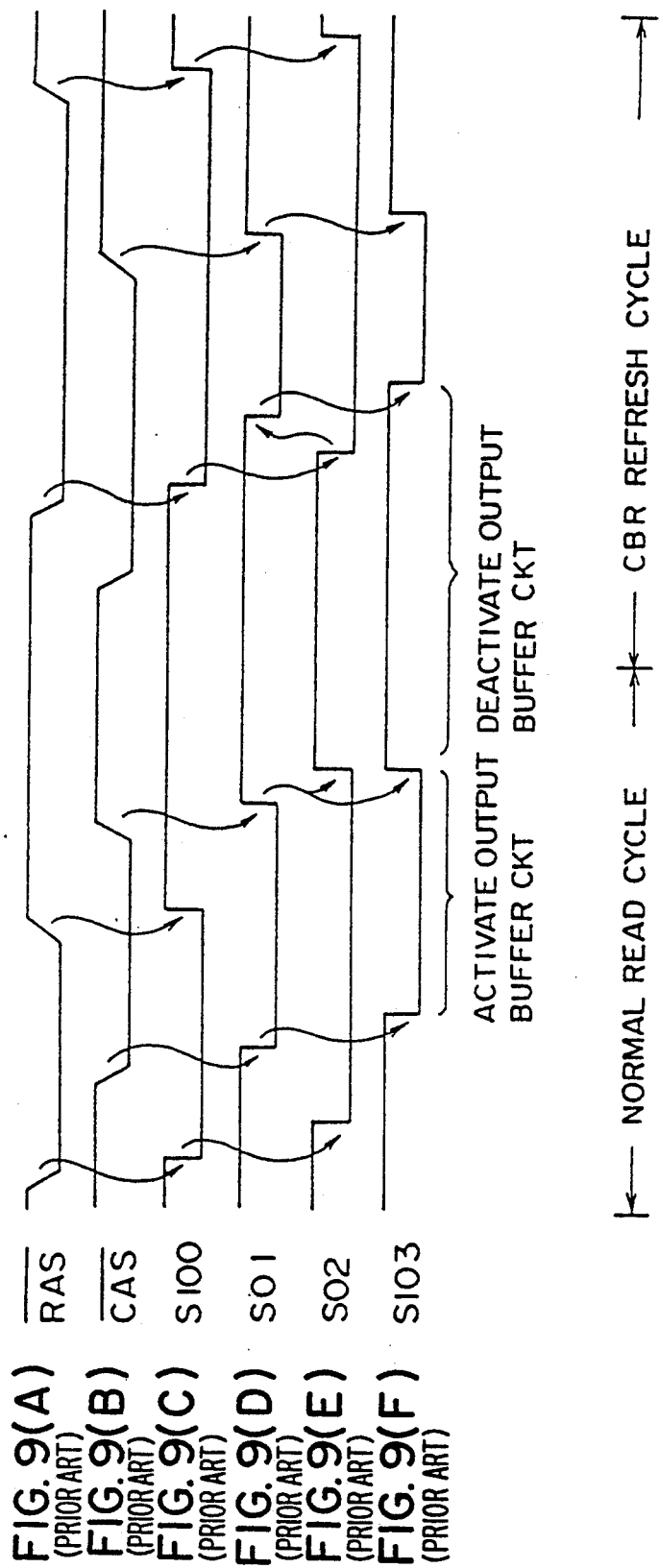
FIGS. 9(A)-9(F) are diagrams showing the operation of the circuit of FIG. 8.

Referring to FIG. 18, the circuit 20 used in the system of FIG. 2 is no longer used and the circuit 22 that produces the output control signal S103 in response to the signals S100 and the /CAS signal is used in place therefore. Therefore, the output signal S103 of the circuit 22 is not only supplied to the output control circuit 25 but also to the circuit 21B and further to a circuit 24B that replaces the conventional circuit 24A. Further, the conventional circuit 23A is now replaced with a circuit 23B of which construction will be described later in detail. In addition, there is provided a CAS activation circuit 26 that produces an output signal S131 and supplies the same to the address control circuit 21. Otherwise, the circuit of FIG. 18 is constructed identically to the circuit of FIG. 2.

Figure 19:
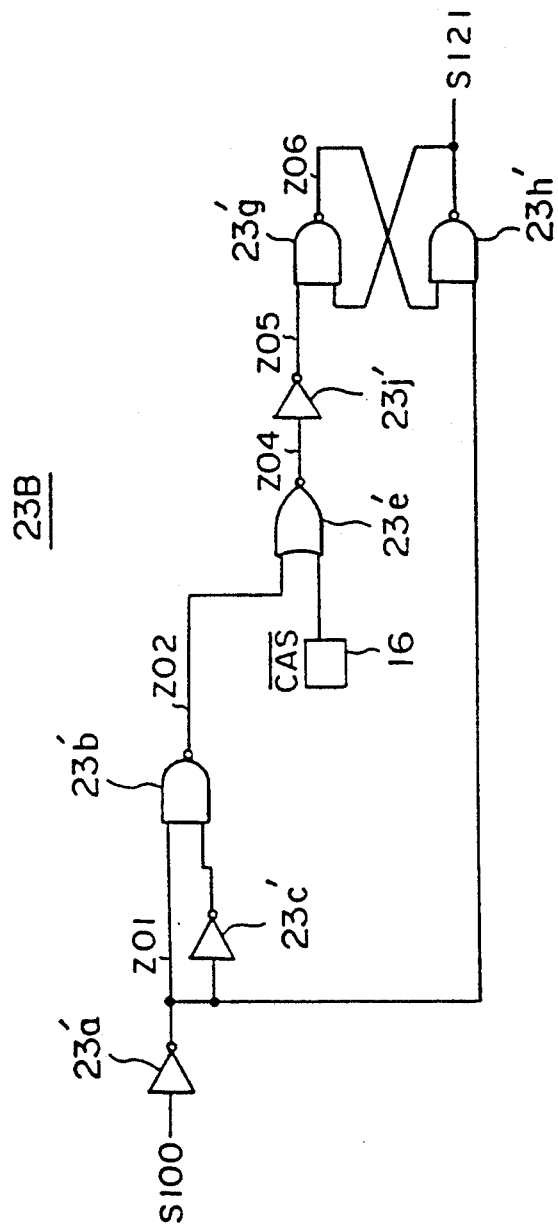
FIG. 19 is a block diagram showing a part of the control system of FIG. 18.

FIG. 19 shows the construction of the circuit 23B.

Figure 10:
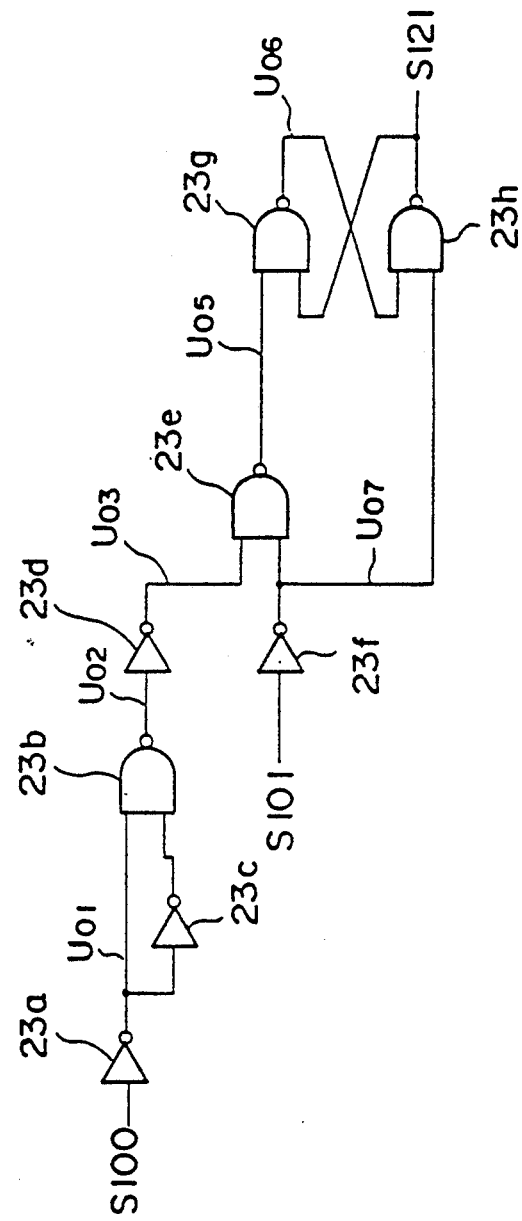
FIG. 10 is a block diagram showing a part of the control system of FIG. 2.

Referring to FIG. 19, the detection circuit 23B has a generally similar construction as the circuit 23A and includes elements 23a'-23c' and 23e'-23h' respectively corresponding to the elements 23a-23c and 23e-23h of FIG. 10, wherein the inverters 23d and 23f are not used and the output of the NAND gate 23b' is supplied directly to the NOR gate 23e' and the /CAS signal at the pad 16 is supplied directly to the NOR gate 23e'. Further, the output of the inverter 23a' is supplied directly to the NAND gate 23h'.

Figure 20:
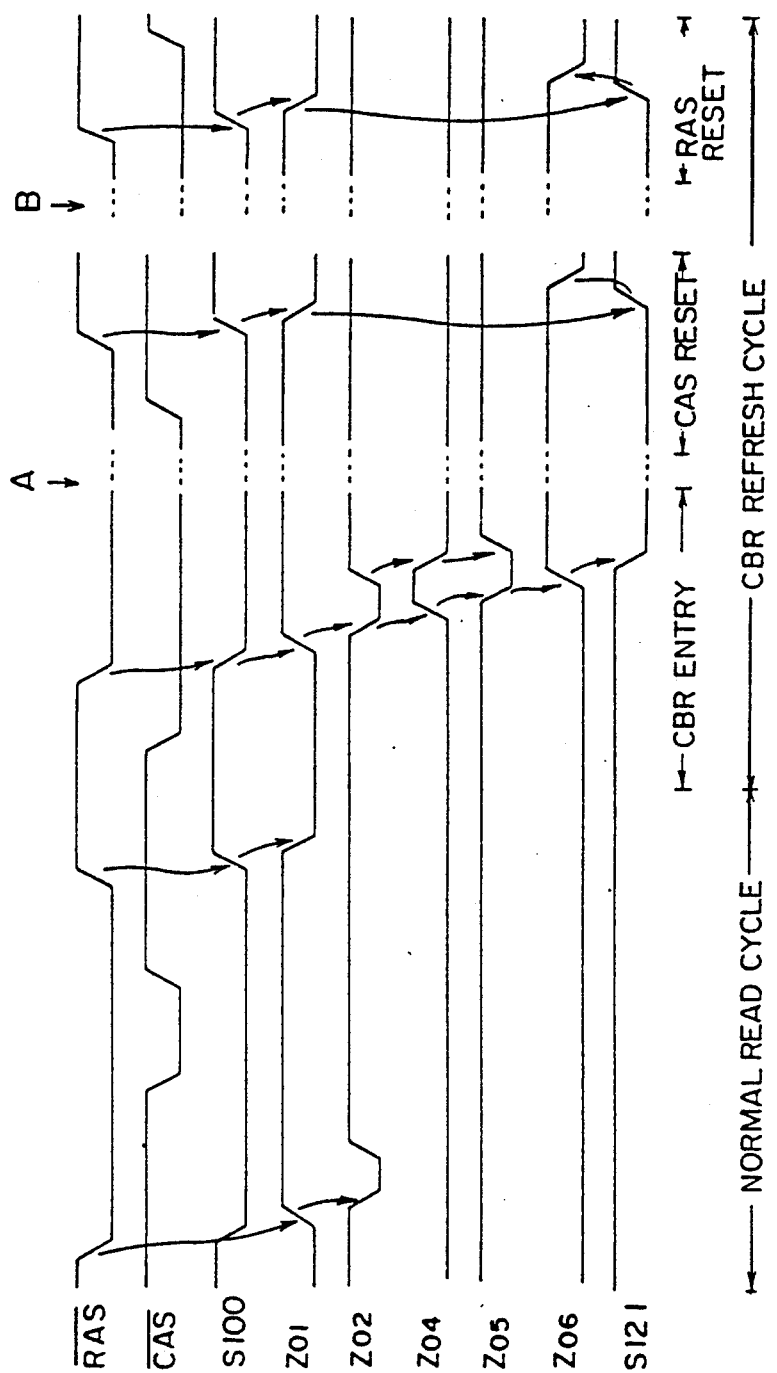
FIGS. 20(A)-20(I) are diagrams showing the operation of the circuit of FIG. 19.

FIGS. 20(A)-20(I) show the operation of the circuit of FIG. 19, wherein FIGS. 20(A)-20(C) represent the waveform of the signals /RAS, /CAS and S100, respectively, whereas the signals Z01, Z02, Z04, Z05 and Z06 of FIGS. 20(D)-20(H) respectively show the output of the inverter 23a, the output of the NAND gate 23b', the output of the NOR gate 23e', the output of the inverter 23j' and the output of the NAND gate 23g' respectively. Further, FIG. 20(I) shows the output signal S121 of the NAND gate 23h'.

Referring to FIGS. 20(A)–20(I), it will be noted that the signal Z02 experiences a momentary transition to the low level state in response to the leading edge of the signal Z01, as indicated in FIG. 20(E), and the NAND gate 23e' produces the output signal Z04 in response to the signal Z02 during the low level interval of the /CAS signal, as indicated in FIG. 20(F). Therefore, it will be noted that the signals Z04 and Z05 exhibit a transition only in the refreshing interval, as indicated in FIGS. 20(F) and 20(G). The negative step of the signal Z05, shown in FIG. 20(G), in turn triggers a latching of the flip-flop formed by the NAND gates 23g' and 23h' during the high level interval of the signal Z01 and hence during the low level interval of the signal S100, wherein the latching is released upon the transition of the signal S100 to the high level state. In response to the latching operation of the NAND gates 23g' and 23h', the signal Z06 is produced, as indicated in FIG. 20(H), and the output signal S121 is produced as a logic inversion of the signal Z06, as indicated in FIG. 20(I).

In the foregoing operation, it should be noted that the signal S121 returns to the high level state in response to the trailing edge of the /RAS signal in both of the situations A and B. As already noted, in situation A, the /CAS signal returns to the high level state before the /RAS signal, while, in situation B, the /RAS signal returns first to the high level state before the /CAS signal.

Figure 21:
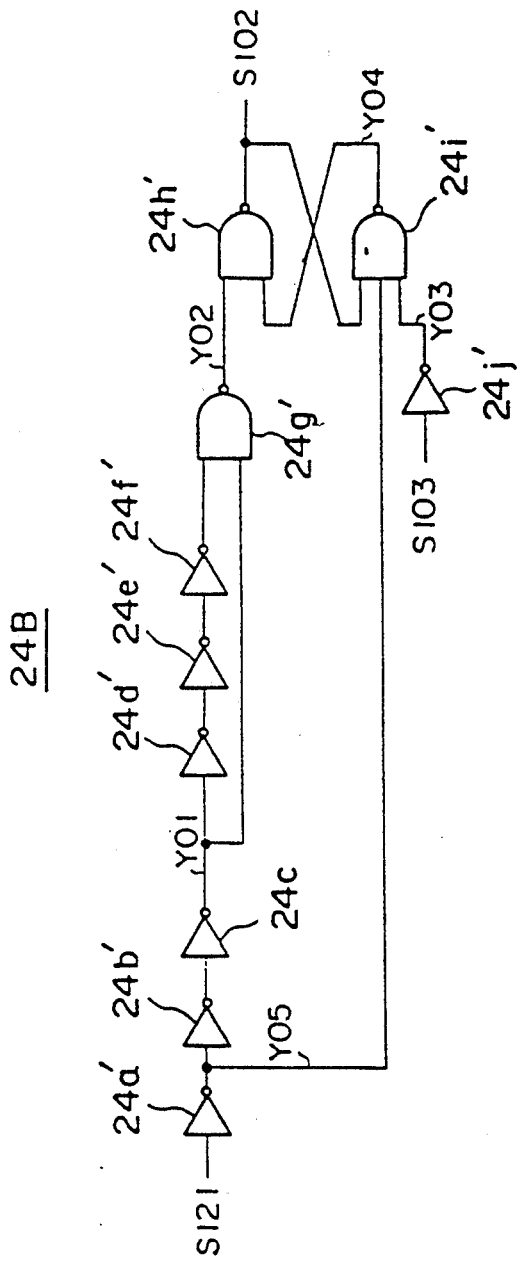
FIG. 21 is a block diagram showing a part of the control system of FIG. 18.
Figure 22:
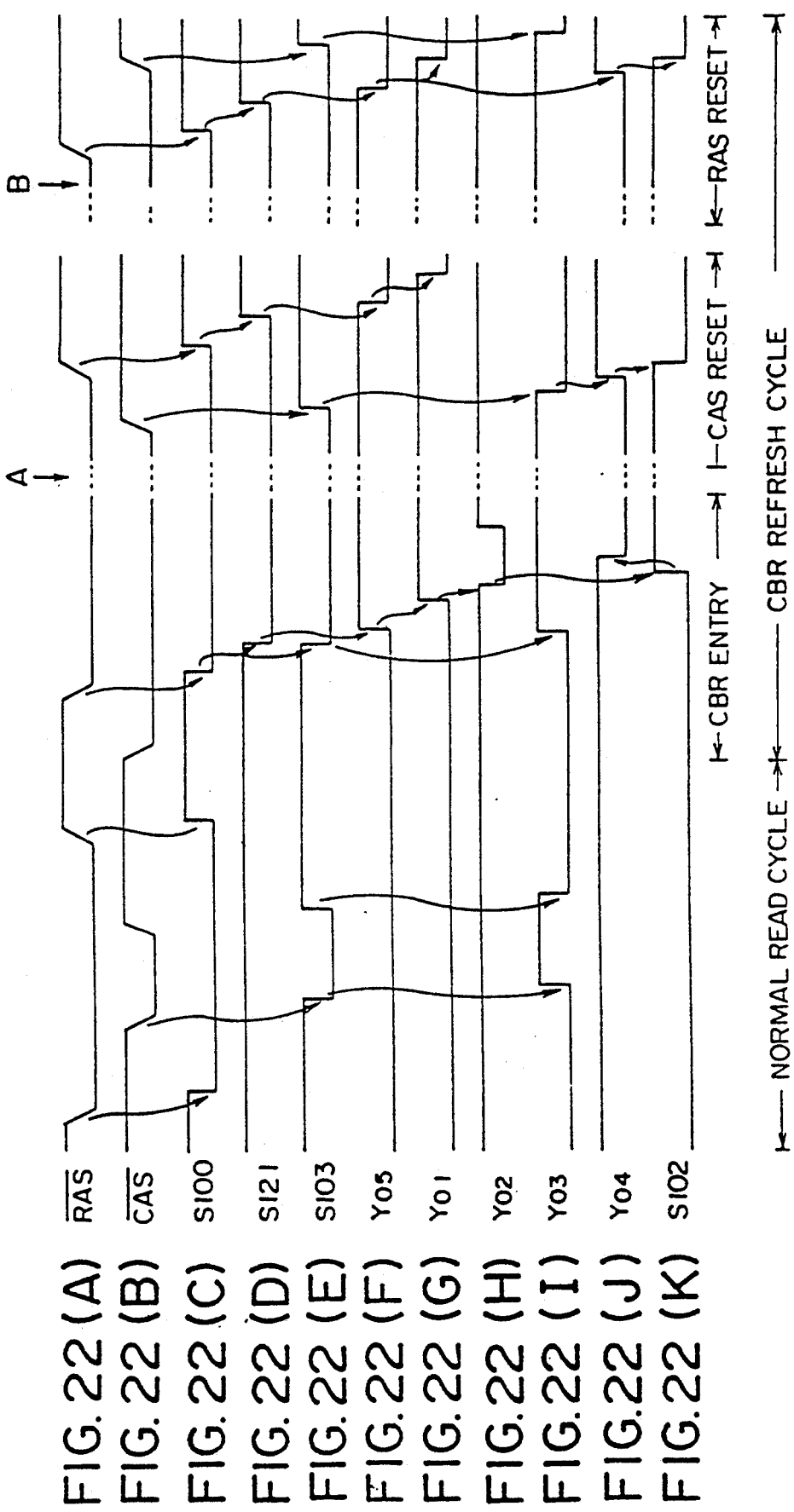
FIGS. 22(A)-22(K) are diagrams showing the operation of the circuit of FIG. 21.

FIG. 21 shows the construction of the circuit 24B.

Referring to FIG. 21, the fresh control 24B has a construction similar to the circuit 24A and includes elements 24a'–24i' that correspond, respectively, to the elements of the circuit 24A except for a NAND gate 24i' that replaces the NAND gate 24i. Further, the circuit 24B is modified such that the output signal of the inverter 24A is supplied to one of the input terminals of the NAND gate 24 as a signal Y05. There, the NAND gate 24i' is supplied with the output of the NAND gate 24h and the output of the inverter 24g as well as the foregoing signal Y05 simultaneously.

FIGS. 22(A)–22(K) show the operation of the circuit 24B, wherein the output of the inverter is represented as Y01, the output of the NAND gate 24g is represented as Y02, the output of the inverter 24g is represented as Y03 and the output of the NAND gate 24j is represented as Y04.

Referring to FIGS. 22(A)–22(K), it will be noted that the output signal S102 of the flip-flop circuit that is formed of the NAND gates 24h' and 24i', is gated by the low level state of the signal S121 that is supplied to the NAND gate 24i' as the signal Y05 after inversion by the inverter 24a' and the low level state of the signal S103 that is supplied also to the NAND gate 24i' as the signal Y03 after inversion by the inverter 24g'. Thereby, the output signal is reset in response to the transition of the signal S121 or the signal S103, whichever comes first. In the situation A, where the /CAS signal causes a transition to the high level state before the /RAS, the output signal S102 of the circuit 24B is reset to the low level state in response to the trailing edge of the signal S103 and hence the trailing edge of the /CAS signal. In the situation B, where the /RAS signal causes a transition to the high level state before the /CAS, the output signal is reset to the low level state in response to the trailing edge of the /RAS signal.

Further, FIG. 23 shows the construction of the circuit 26 that is used for resetting the address control circuit 21 in response to the trailing edge of the /RAS signal. It should be noted that the operation of the dynamic random access memory is repeated with a number of operational intervals, each extending from a leading edge of the /RAS signal and a corresponding trailing edge of the /RAS signal. Thus, the selection of the bit line achieved by the address control circuit 21B has to be reset at each trailing edge of the /RAS signal or earlier.

Figure 11:
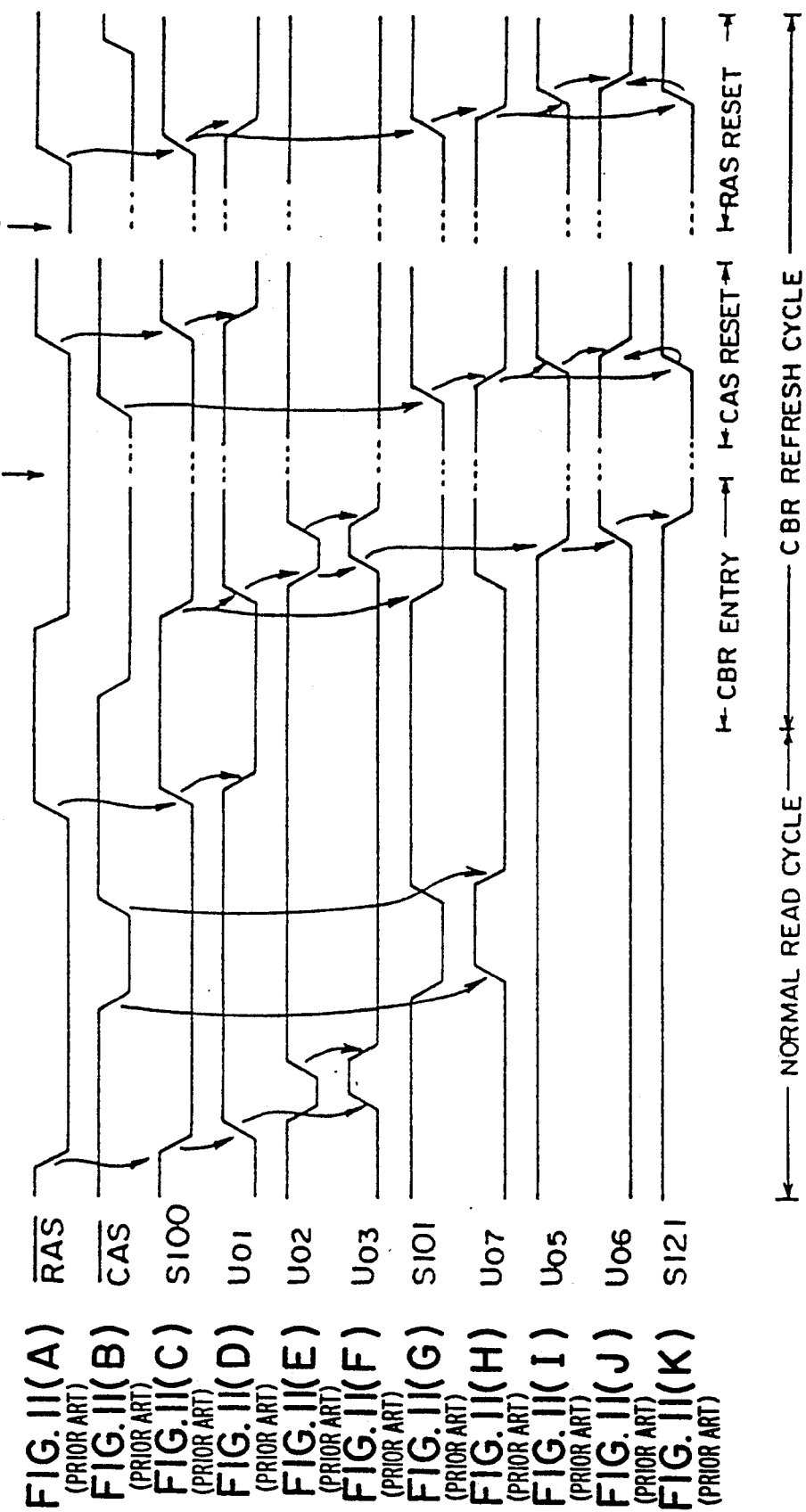
FIGS. 11(A)-11(K) are diagrams showing the operation of the circuit of FIG. 10.
Figure 12:
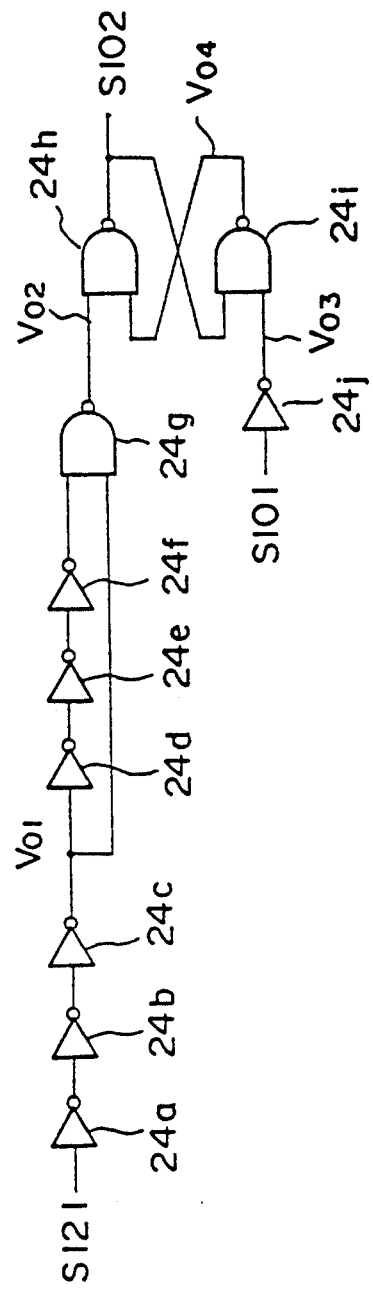
FIG. 12 is a block diagram showing a part of the control system of FIG. 2.
Figure 13:
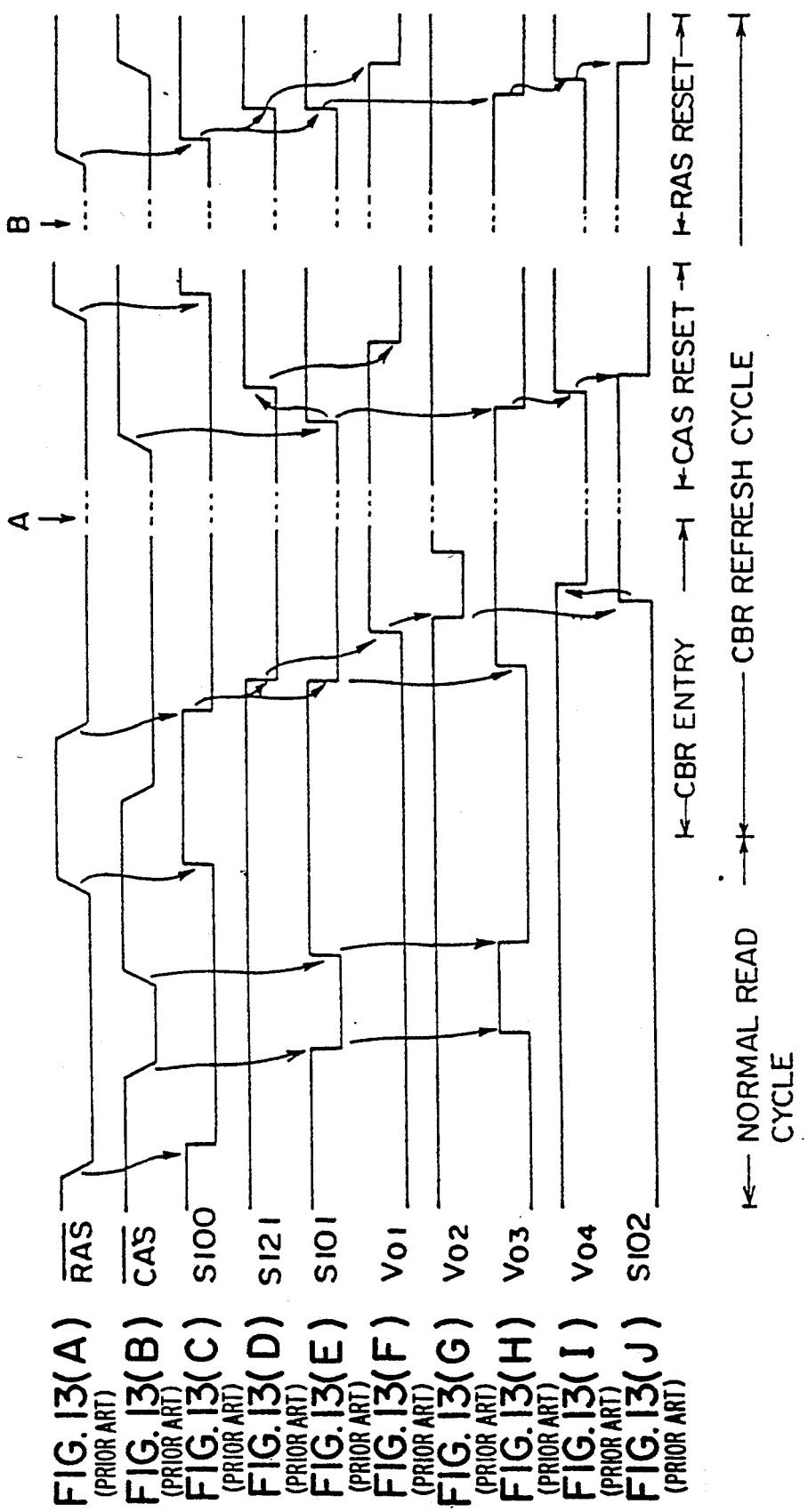
FIGS. 13(A)-13(J) are diagrams showing the operation of the circuit of FIG. 12.
Figure 14:
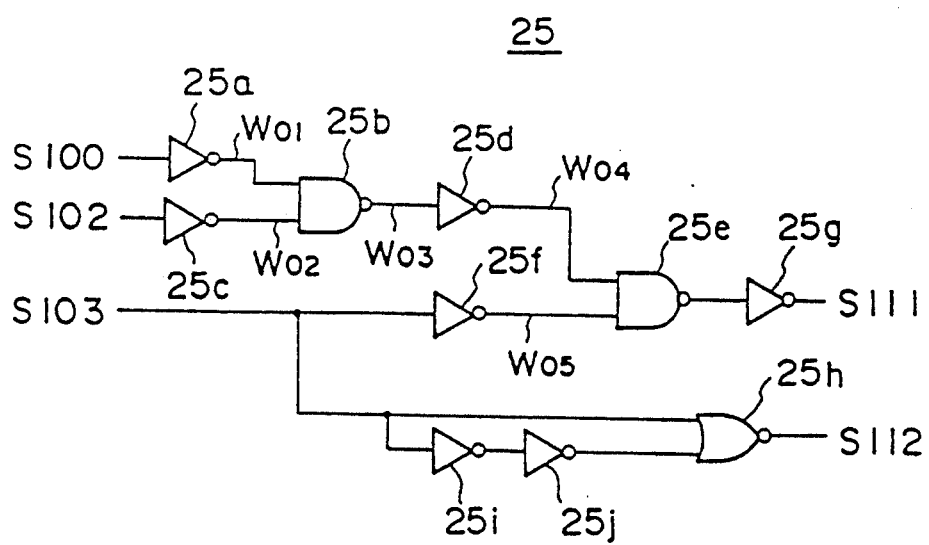
FIG. 14 is a block diagram showing a part of the control system of FIG. 2.
Figure 15:
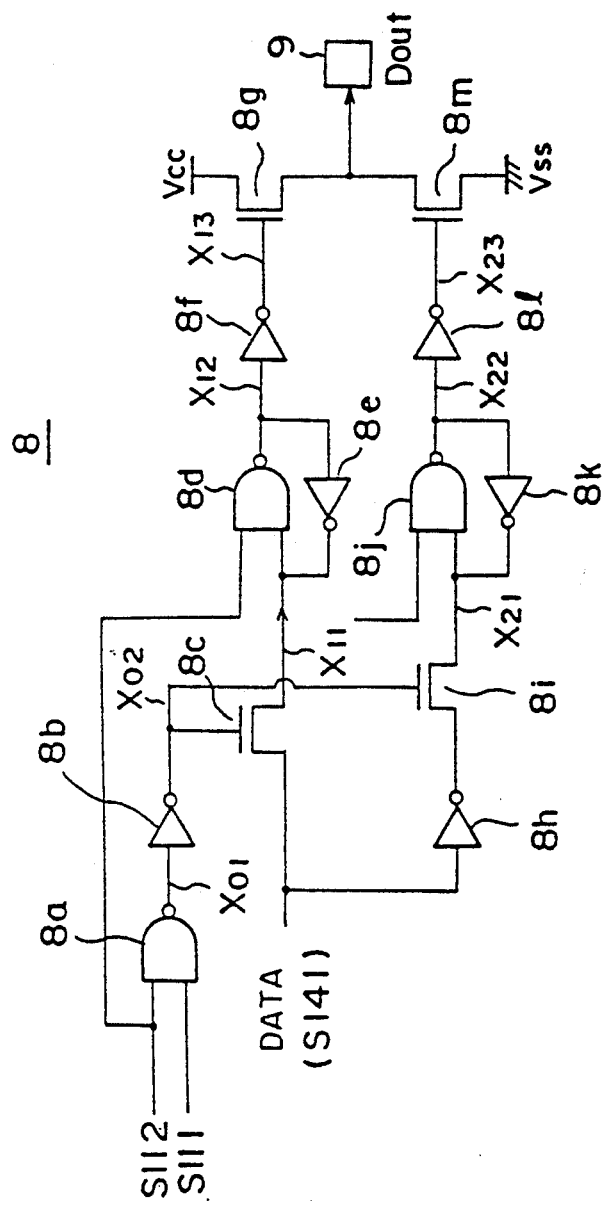
FIG. 15 is a block diagram showing a part of the control system of FIG. 2.
Figure 16:
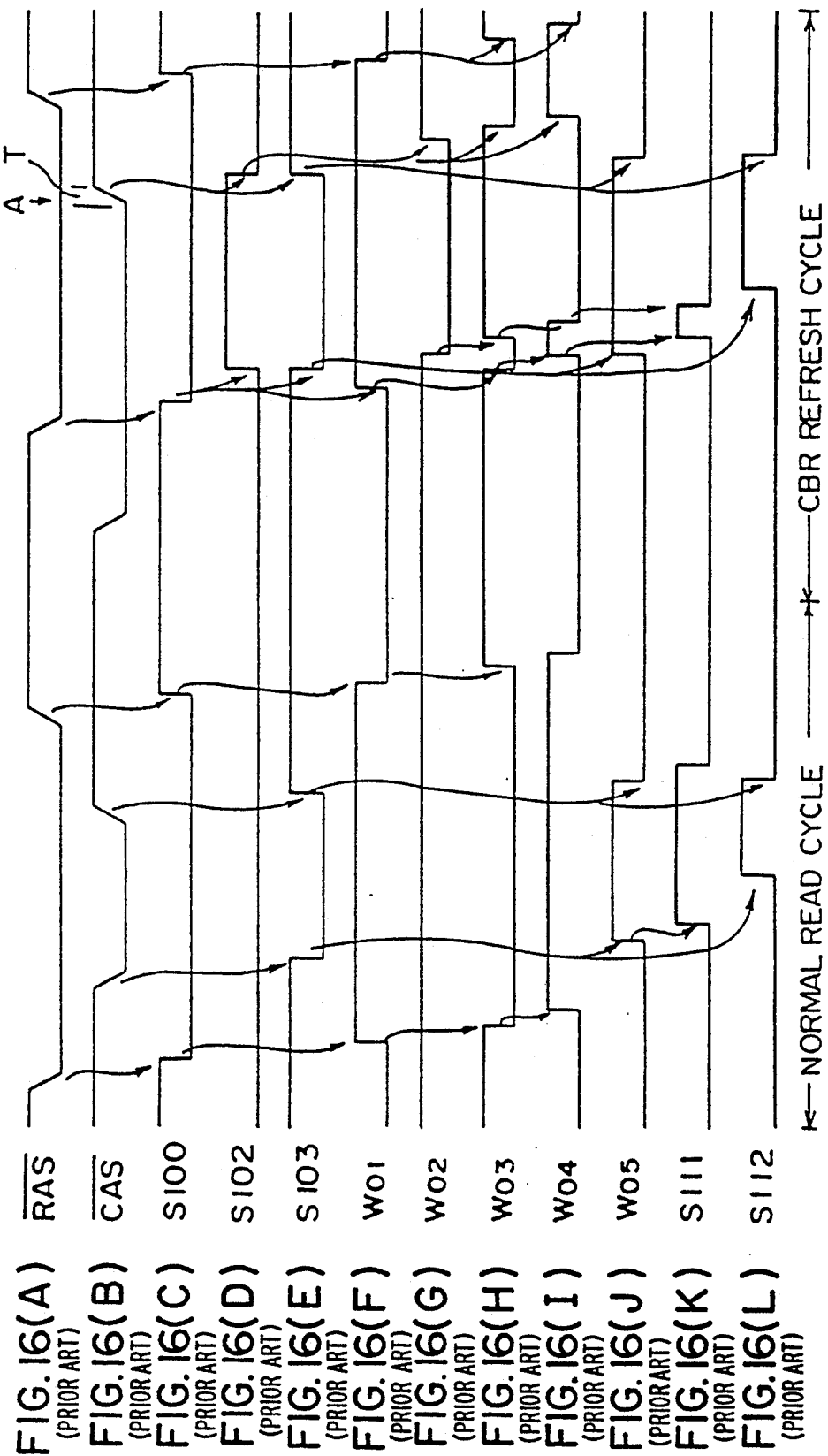
FIGS. 16(A)-16(L) are diagrams showing the operation of the circuit of FIG. 14.
Figure 17:
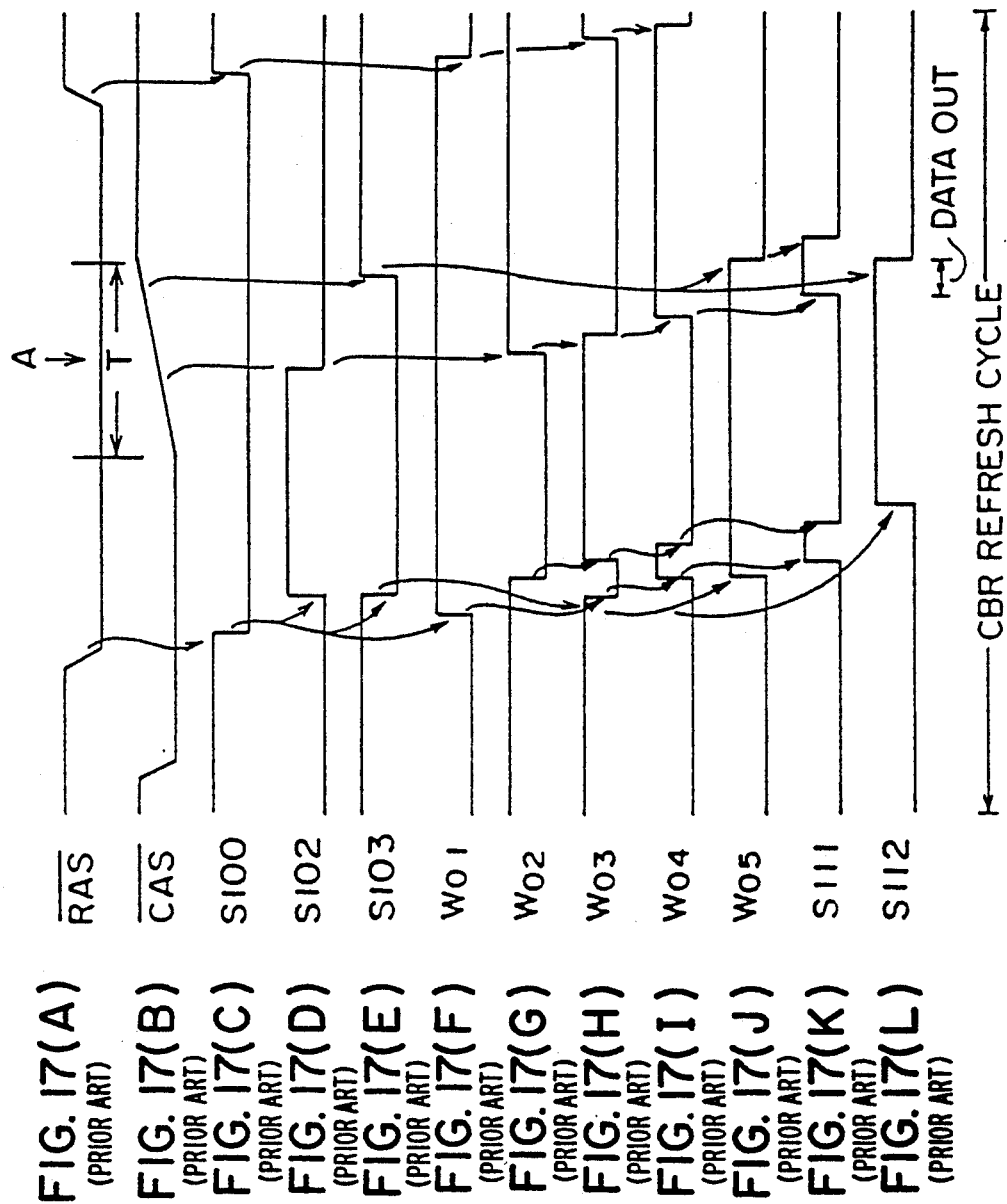
FIGS. 17(A)-17(L) are diagrams corresponding to FIGS. 16(A)-16(L) and showing the problems associated with the operation of the circuit of FIG. 14.

In the conventional circuit of FIG. 2, the control of the address control circuit 21A is achieved in response to the trailing edge of the signal S101 that in turn occurs in response to the trailing edge of the /CAS signal or /RAS signal, whichever comes first, as represented in FIG. 11(G). On the other hand, the control signal S131 used for the circuit of FIG. 18 maintains the low level state even after the trailing edge of the /RAS signal, as indicated in the situation "B" shown in FIG. 22(E). Thus, the address control circuit 21B used in the present invention needs an independent reset mechanism such that the operation of the circuit 21B is reset in response to the trailing edge of the /RAS signal. Circuit 26 of FIG. 23 is provided for this resulting purpose.

Referring to FIG. 23, the circuit 26 includes an inverter 26a supplied with the signal S100 and a NAND gate 26b that receives an output signal P01 of the inverter 26a. Further, the same signal S100 is supplied to an inverter 26c and supplied to the NAND gate 26b via another path including inverters 26d and 26e as a signal P02. Thereby, the NAND gate 26b produces the output S131 as a result of the logic combination of the signals P01 and P02.

FIGS. 24(A)–24(D) show the operation of the circuit 26, wherein it should be noted that the signal S100 is provided in response to the /RAS signal, as indicated in FIG. 24(A). There, the signal P02 is delayed with respect to the signal P01 and the signal S131 takes the low level state only in the interval wherein the signals P01 and P02 are both high. Therefore, it should be noted that the trailing edge of the signal S131 is defined by the trailing edge of the /RAS signal.

FIG. 25 shows the construction of the address control circuit 21B, wherein the circuit 21B has a construction substantially identical with the circuit 21A except that the inverter 211 in the address latch part 21a is replaced with a NAND gate 212' which is supplied the signal S131 of the circuit 26 via an inverter 213. Thereby, the address buffer circuit 4 is reset in response to the trailing edge of the /RAS signal even when the signal S103 continues after the trailing edge of the /RAS signal. As a result of the resetting produced by the signal S131, the address control circuit 21B experiences a resetting in response to the trailing edge of the /RAS signal, as already explained.

FIGS. 26(A)–26(H) show the overall operation of the control system of FIG. 18 for the case where the /CAS signal shows a clear trailing edge. In other words, the situation shown in these drawings corresponds to the short transition time of the /CAS signal.

Referring to the drawings, it will be noted that the signal S111 is produced only in the normal read cycle. Thus, the data output occurs only in the normal read cycle and the output buffer circuit 8 maintains the high impedance state in the refreshing cycle.

FIGS. 27(A)–27(H) show the operation of the system of FIG. 18 for the case where the transition time of the /CAS signal is large. As shown, the transition of the trailing edge of the signal S103 occurs in correspondence to the trailing edge of the signal S102 and the transition of the signal S111 never occurs in the refreshing cycle. In other words, the data output is prohibited in this case as long as the random access memory is in the refreshing cycle, and the output impedance of the output buffer circuit of the device is held at the high level state.

Further, the present invention is not limited to the embodiments described heretofore, but various variations and modifications may be made without departing from the scope of the invention.

What is claimed is:

1. A dynamic random access memory, comprising:
   a plurality of memory cells each storing information in the form of electric charges, said memory cells being arranged to form a memory cell array;
   addressing means supplied with address data for selecting a memory cell from said memory cell array;
   input/output means for writing and/or reading information to and from said selected memory cell; and
   control means for controlling said input/output means such that said input/output means exhibits a high impedance state during a refreshing cycle of said memory cells, said control means comprising:
   first input means supplied with a first timing signal for outputting a first control signal in response thereto;
   second input means supplied with a second, different timing signal for outputting a second control signal in response thereto, said first timing signal and said second timing signal having a timing relationship such that a read/write cycle for writing and reading information to and from the selected memory cell is achieved when said first timing signal precedes said second timing signal and such that a refreshing cycle for refreshing said memory cells is achieved when said second timing signal precedes said first timing signal;
   a timing control circuit supplied with said first and second control signals from said first and second input means, respectively, for producing a third control signal in response thereto such that said third control signal is produced in response to a leading edge of said second control signal and terminates in response to a trailing edge of said second control signal when in said read/write cycle and such that said third control signal is produced in response to a leading edge of said first control signal and terminates in response to a trailing edge of said second control signal when in said refreshing cycle;
   a detection circuit supplied with said first and second control signals from said first and second input means, respectively, for producing a fourth control signal when the timing of said second control signal has preceded the timing of said first control signal, thereby corresponding to said refreshing cycle;
   a refresh control circuit supplied with said third control signal from said timing control circuit and said fourth control signal from said detection circuit for producing a fifth control signal such that said fifth control signal is produced in correspondence to a time interval extending from a time corresponding to the leading edge of said fourth control signal to a time corresponding to the trailing edge of said third control signal;
   an output control circuit supplied with said third control signal from said timing control circuit and with said fifth control signal from said refresh control circuit, for producing sixth and seventh control signals such that said sixth control signal is produced only in said read/write cycle, in correspondence to an interval extending from a time corresponding to the leading edge of said third control signal to a time corresponding to the trailing edge of said third control signal and such that said seventh control signal is produced in said read/write cycle in correspondence to an interval extending from a time corresponding to the leading edge of said third control signal to a time corresponding to the trailing edge of said third control signal, said seventh control signal produced in said refreshing cycle in an interval extending from a time corresponding to the leading edge of said third control signal to a time corresponding to the trailing edge of said third control signal, wherein said seventh control signal does not overlap said sixth control signal during said refresh cycle;
   said output control circuit controlling said input/output means by said sixth and seventh control signals such that reading and/or writing of information to and from a selected memory cell is allowed only when said sixth and seventh control signals are provided simultaneously, said output control circuit further controlling said input/output means such that said input/output means exhibits a high output impedance state when said seventh control signal is not provided.

2. A dynamic random access memory as claimed in claim 1, wherein said first input means comprises a delay circuit supplied with said first timing signal for producing said first control signal with a predetermined time delay therefrom.

3. A dynamic random access memory as claimed in claim 1, wherein said second input means produces said second control signal with the same timing as said second timing signal.

4. A dynamic random access memory as claimed in claim 2, wherein said delay circuit is formed of a plurality of inverters cascaded with each other.

5. A dynamic random access memory as claimed in claim 1, wherein said timing control circuit comprises a latch circuit that latches said first control signal in response to a leading edge of said second control signal, said latch circuit being reset in response to a trailing edge of said second control signal.

6. A dynamic random access memory as claimed in claim 1, wherein said detection circuit comprises an edge detection circuit for detecting a leading edge of said first control signal, a gating circuit for gating an output of said edge detection circuit such that said output signal of said edge detection circuit is passed through said gating circuit in response to said second control signal, a latch circuit for latching said output signal of said edge detection circuit after passing through said gating circuit, and a resetting circuit for resetting said latch circuit in response to a trailing edge of said first control signal.

7. A dynamic random access memory as claimed in claim 1, wherein said refresh control circuit comprises an edge detection circuit supplied with said fourth control signal for detecting a leading edge thereof, a latch circuit for latching an output of said edge detection circuit, an activation circuit for activating said latching circuit in response to said fourth control signal, and a resetting circuit supplied with said third control signal for resetting said latch circuit in response to the trailing edge of said third control signal.

8. A dynamic random access memory as claimed in claim 1, wherein said output control circuit comprises a first gating circuit for gating said first control signal by said fifth control signal such that said first gating circuit produces an output signal in response to said first control signal only in an interval wherein said fifth control signal has a predetermined logic level;

a second gating circuit supplied with said output of said first gating circuit and said third control signal for producing said sixth control signal in response to said output signal of said first gating circuit only in an interval where said third control signal has a predetermined logic level; and an edge detection circuit supplied with said third control signal for producing a seventh control signal in response to a leading edge of said third control signal.

9. A dynamic random access memory as claimed in claim 1, wherein said dynamic random access memory further comprises address control means supplied with said third control signal from said timing control circuit for activating said addressing means, said dynamic random access memory further comprising activating and deactivating means supplied with said first-control signal for activating and deactivating said address control means in response to a trailing edge of said first timing signal.

* * * * *

UNITED STATES PATENT AND TRADEMARK OFFICE
CERTIFICATE OF CORRECTION

PATENT NO. : 5,327,387
DATED : July 5, 1994
INVENTOR(S) : Akira SUGIURA et al.

It is certified that error appears in the above-indentified patent and that said Letters Patent is hereby corrected as shown below:

Col. 2, line 52, delete "S103" and insert therefor --S100--;
  Line 57, delete "the"(2nd occurrence).
Col. 3, line 2, after "8", delete the comma (",").
Col. 5, line 32, after "signal", insert a comma (",");
  Line 52, after "signal", first occurrence, delete the comma (",");
  Line 52, after "signal", second occurrence, insert a comma (",").
Col. 6, line 49, after "the", insert --output control--.
Col. 7, line 42, delete "8c" and insert therefor --8d--.
Col. 12, line 5, delete "(I)" and insert therefor --(K)--;
  Line 9, delete "(K)" and insert therefor --(I)--.
Col. 13, line 33, after "control", insert --circuit--;
  Line 39, delete "24" and insert therefor --24i'--.

Signed and Sealed this

Twenty-second Day of November, 1994

Attest:

BRUCE LEHMAN

Attesting Officer

Commissioner of Patents and Trademarks